US010648744B2

(12) United States Patent
Veto et al.

(10) Patent No.: US 10,648,744 B2
(45) Date of Patent: May 12, 2020

(54) HEAT TRANSFER DEVICES AND METHODS FOR FACILITATING CONVECTIVE HEAT TRANSFER WITH A HEAT SOURCE OR A COLD SOURCE

(71) Applicant: The Boeing Company, Chicago, IL (US)

(72) Inventors: Christopher C. Veto, Hawthorne, CA (US); Ernest E. Bunch, Huntington Beach, CA (US)

(73) Assignee: The Boeing Company, Chicago, IL (US)

(*) Notice: Subject to any disclaimer, the term of this patent is extended or adjusted under 35 U.S.C. 154(b) by 39 days.

(21) Appl. No.: 16/059,872

(22) Filed: Aug. 9, 2018

(65) Prior Publication Data
US 2020/0049414 A1 Feb. 13, 2020

(51) Int. Cl.
*F28F 11/02* (2006.01)
*B63G 8/36* (2006.01)
(Continued)

(52) U.S. Cl.
CPC .......... *F28D 11/02* (2013.01); *B63G 8/36* (2013.01); *B64D 13/006* (2013.01);
(Continued)

(58) Field of Classification Search
CPC .......... F28F 2280/105; F28F 2280/10; F28F 2280/00; F28F 5/00; F28F 23/00;
(Continued)

(56) References Cited

U.S. PATENT DOCUMENTS 1,408,631 A * 3/1922 Para ................. F28F 1/32
165/77
3,623,546 A * 11/1971 Banthin ............ F01P 9/00
165/51
(Continued)

FOREIGN PATENT DOCUMENTS

CN 107846814 3/2018
GB 1164276 9/1969

OTHER PUBLICATIONS

Machine-generated English translation of the abstract of CN 107846814, downloaded from Espacenet.com, Nov. 25, 2019.
(Continued)

*Primary Examiner* — Jianying C Atkisson
*Assistant Examiner* — Jose O Class-Quinones
(74) *Attorney, Agent, or Firm* — DASCENZO Intellectual Property Law, P.C.

(57) ABSTRACT

Heat transfer devices and methods for enclosing a heat source and facilitating convective heat transfer from the heat source. A heat transfer device includes an outer wall having an outer surface exposed to an environment of the heat transfer device and defining an outer shape of the heat transfer device, and an inner wall defining a flow passage through the heat transfer device. The outer wall and the inner wall collectively define an internal volume that is configured to house the heat source. The flow passage includes an inlet configured to receive a fluid from the environment, and an outlet configured to exhaust the fluid from the flow passage that includes a core region extending between the inlet and the outlet and configured to deliver the fluid from the inlet to the outlet and allow heat to exchange between the fluid within the core region and the internal volume.

20 Claims, 11 Drawing Sheets

(51) Int. Cl.
*B64D 13/00* (2006.01)
*H05K 7/20* (2006.01)
*F28D 11/02* (2006.01)

(52) U.S. Cl.
CPC ..... *H05K 7/20145* (2013.01); *H05K 7/20163* (2013.01); *H05K 7/20236* (2013.01)

(58) Field of Classification Search
CPC .......... H05K 7/20236; H05K 7/20145; H05K 7/20163; F28D 11/02; F28D 2021/0021; F28D 11/00; B63G 8/36; B64D 13/006
See application file for complete search history.

(56) References Cited

U.S. PATENT DOCUMENTS

| | | | |
|---|---|---|---|
| 4,126,017 A | | 11/1978 | Bytniewski et al. |
| 4,590,538 A | * | 5/1986 | Cray, Jr. ............ H05K 7/20236 361/700 |
| 4,789,517 A | * | 12/1988 | Webb ...................... B64G 1/503 126/643 |
| 5,119,637 A | | 6/1992 | Bard et al. |
| 5,458,189 A | * | 10/1995 | Larson ................ F28D 15/0241 165/104.27 |
| 5,689,403 A | | 11/1997 | Robertson, Jr. et al. |
| 5,943,211 A | * | 8/1999 | Havey ................... H01L 23/427 165/80.4 |
| 6,889,763 B1 | | 5/2005 | Subramanian et al. |
| 2008/0191723 A1 | * | 8/2008 | Osato ................... G01R 1/0483 324/756.01 |
| 2012/0014063 A1 | | 1/2012 | Weiss |
| 2012/0103571 A1 | | 5/2012 | Wu et al. |
| 2013/0056192 A1 | | 3/2013 | Lee |
| 2013/0192275 A1 | | 8/2013 | Loung et al. |
| 2015/0049436 A1 | | 2/2015 | Wu et al. |
| 2017/0145892 A1 | * | 5/2017 | Peck, Jr. ................ B64D 27/10 |
| 2017/0223868 A1 | | 8/2017 | Zheng et al. |
| 2018/0132382 A1 | | 5/2018 | Baran et al. |
| 2018/0170553 A1 | * | 6/2018 | Wang .................... B64D 33/08 |

OTHER PUBLICATIONS

U.S. Appl. No. 15/707,898, filed Sep. 8, 2017, Bunch.
U.S. Appl. No. 16/015,018, filed Jun. 21, 2018, Bunch et al.
European Patent Office, Partial European Search Report for related European Patent Application No. 19186920, dated Jan. 2, 2020.

* cited by examiner

HEAT TRANSFER DEVICES AND METHODS FOR FACILITATING CONVECTIVE HEAT TRANSFER WITH A HEAT SOURCE OR A COLD SOURCE

FIELD

The present disclosure relates to unique heat transfer devices and more particularly to heat transfer devices for affixing a heat source and/or a cold source, and facilitating convective heat transfer from or to such a source.

BACKGROUND

Some devices, especially electronic devices, generate/bestow heat, in some cases excess and/or wasted heat. This heat must be controlled and dissipated properly to prevent reduced performance and/or premature failures. Therefore, the thermal interaction of any device with its environment is an important design feature to facilitate its proper functionality. Often, the thermal interaction of heat-generating devices is managed by driving a coolant proximate to the devices to draw generated heat away from the devices, in some cases uniformly. However, with current technology it is difficult to cool heat-generating devices that are located at peripheral locations of an article/body/structure, due to difficulty in driving coolant to the peripheral locations. Thus, there exists a need for improved heat transfer devices for affixing to a heat source and facilitating convective, conductive, and/or radiative heat transfer from the heat source.

SUMMARY

Heat transfer devices and methods for enclosing a heat source and facilitating convective heat transfer from or to the heat source are disclosed. A heat transfer device, which also may be referred to herein as a "Heat Transferring Sphere (XTS)," includes an outer wall having an outer surface exposed to an environment of the heat transfer device and defining an outer shape of the heat transfer device and an inner wall defining a flow passage through the heat transfer device. The outer wall and the inner wall collectively define an internal volume that is configured to affix to and/or enclose the heat source. The flow passage comprises an inlet configured to receive a fluid from the environment and an outlet configured to exhaust the fluid from the flow passage. Additionally, the flow passage also comprises a core region extending between the inlet and the outlet and configured to deliver the fluid from the inlet to the outlet and allow heat to exchange between the fluid within the core region and the internal volume.

A method includes above receiving a fluid into one or more inlets of a heat transfer device having an outer wall and an inner wall, wherein the inner wall defines a flow passage through the heat transfer device that comprises the inlet, a core region, and an outlet, and wherein an internal volume is defined between the outer wall and the inner wall. The method further includes flowing the fluid from the inlet and into the core region of the heat transfer device, flowing the fluid within the core region of the heat transfer device, exchanging heat between the heat source and the fluid within the core region, wherein the heat source is at least partially located within the internal volume, and flowing the fluid and the heat from the core region and out of the heat transfer device via one or more outlets.

The features, functions, and advantages that have been discussed can be achieved independently in various embodiments or may be combined in yet other embodiments, further details of which can be seen with reference to the following description and drawings.

DESCRIPTION

Apparatuses and methods for enclosing and/or affixing to a heat source and facilitating convective, conductive, and/or radiative heat transfer from the heat source are disclosed. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

Figure 1:
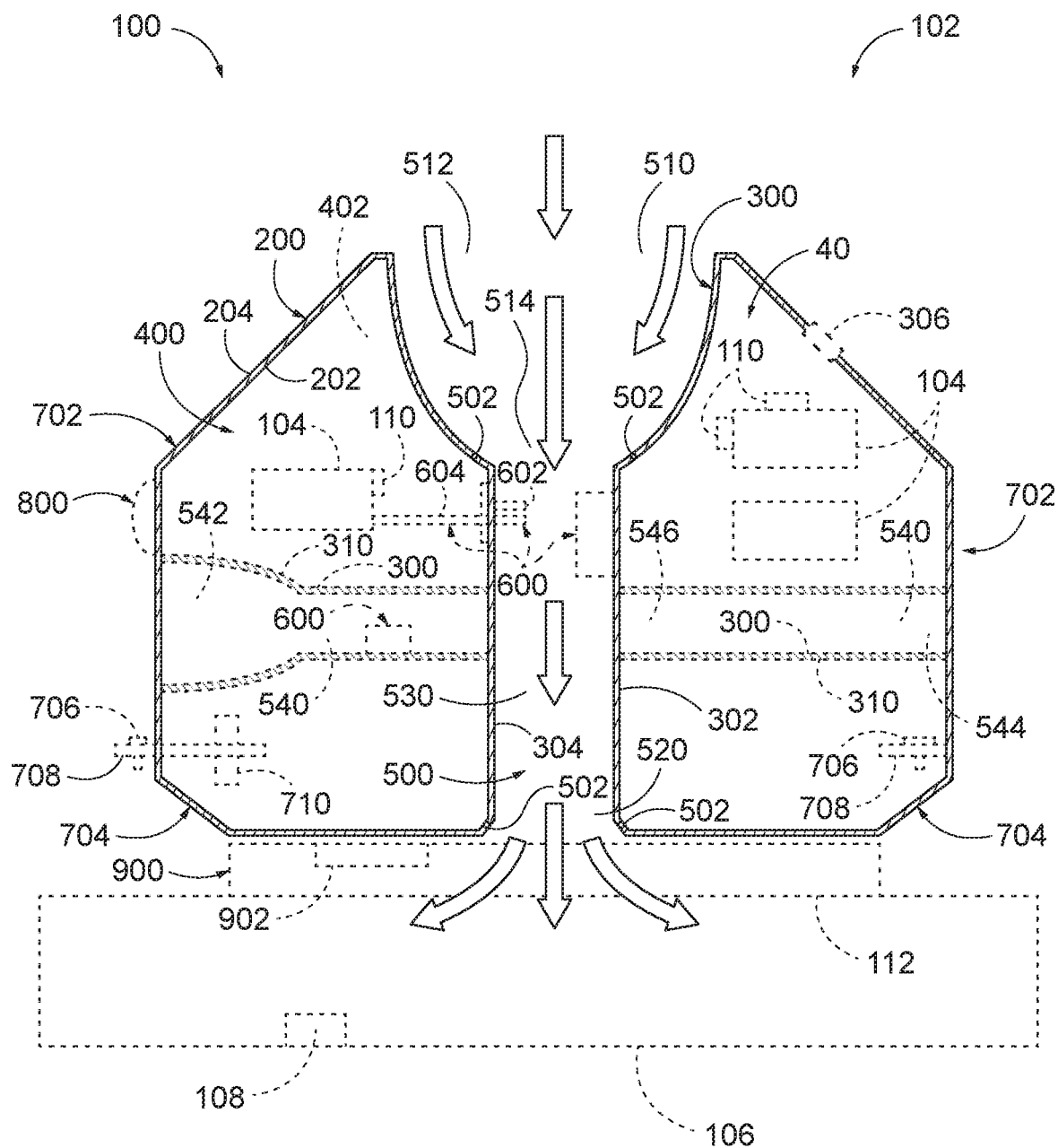
FIG. 1 is a schematic cross-sectional diagram representing heat transfer devices according to the present disclosure.

FIG. 1 is a schematic cross-sectional diagram representing sui generis heat transfer devices 100 according to the present disclosure. In some embodiments, heat transfer devices 100 may be referred to as Heat Transferring Sphere (XTS). As schematically illustrated in FIG. 1, heat transfer devices 100 include at least an outer wall 200, an inner wall 300, and an internal volume 400 collectively defined by the outer wall 200 and the inner wall 300. Additionally, inner wall 300 defines one or more flow passages 500 (e.g., 1-6) through the heat transfer device 100. As further shown in FIG. 1, individual flow passages 500 comprise an inlet 510 configured to receive a fluid from an environment 102, an outlet 520 configured to exhaust the fluid from the flow passage 500 and a core region 530 extending between and in fluid communication with the inlet 510 and the outlet 520.

In various embodiments, the size of an individual heat transfer device 100 may range from a nanoscopic scale to a much larger, a-picayune scale. For example, in some embodiments a heat transfer device 100 may correspond to a modified buckyball. Moreover, in an alternative embodiment a heat transfer device 100 may constitute a large majority, a small minority, or the totality of a vehicle and/or machine, such as a spacecraft or computing device. Instantiations where the XTS comprises the totality of the vehicle may include devices of Skeet form/purpose when air-dropped (e.g., the BLU-108) or of the signaling depth charge form/purpose when descending through water. Other instantiations of water-bound devices include devices intended for bathymetry mapping and/or devices intended for the probing of marine life during the anoxic/hypoxic conditions induced during eutrophication. Heat transfer device 100 is further configured to enclose at least one heat source 104 within the internal volume 400, and to draw heat away from (i.e., cool) heat sources 104 which are enclosed within the internal volume 400, though the XTS Heat transfer device may alternatively draw heat to (i.e., heat) affixed components.

A heat source 104 may include a device that generates heat such as an engine, a generator, an electronic device, an electronic component, wires carrying electrical current, fiber optics, an electrical circuit board, a communications device, etc. Such fiber optics may be used, in some examples, to detect spark and/or flame near the heat transfer device. A red-hot sphere, detected by pilot(s) and/or sensors, can initiate mechanical/electrical/system events, including, but not limited to, shut-off and/or ejection. Alternatively, or in addition, the at least one heat source 104 may include a component that passively acquires heat from another source, such as a heat shield, plasma sheath, a heat sink, etc. In such embodiments, heat transfer device 100 may be configured to draw heat away from an external body 106 and/or from an external component 108.

A heat source 104 may be operatively installed within the internal volume 400 and may be mechanically coupled to an example heat transfer device 100 such that the heat source 104 may be repeatedly attached and/or removed without damage to the heat source 104 or heat transfer device 100. For example, the heat source 104 may be mechanically adjoined and/or affixed to the heat transfer device 100 within the internal volume 400 with one or more fastener elements 110 that may include, for example, magnets, ties, threaded fasteners, snap fasteners, pins, retaining rings, rivets bands, pegs, clips, buttons, clasps, flange, clamps, etc.

To draw heat away from (i.e., cool) heat sources 104 enclosed within the internal volume 400, where in some examples it is within the internal volume 400 where the heat may originate, the core region 530 is configured to allow heat to exchange between the fluid within the core region 530 and the internal volume 400. In this way, heat may be drawn away from the internal volume 400 and/or the at least one heat source 104, transferred to the fluid flowing through the core region 530, and exhausted from the heat transfer device 100 via the outlet 520. The portion of the inner wall 300 that defines the core region 530 may correspond to and/or optionally include a heat transfer material to facilitate such a transfer of heat between the inner wall 300 and the fluid flowing through the core region 530. For example, the inner wall 300 may comprise a conductive material (e.g., AlSi10Mg) that allows heat to exchange between the internal volume 400 and a fluid within the core region 530. In some instances, the core region 530 may contain flow control devices (e.g., check valves, globe valves, etc.). Additionally, the internal volume 400 may contain ridges and/or Juglan Genus Ribs (JGR) to further facilitate heat transfer. Note that there may be other systems which work in unison or interchangeably/separately to transfer heat from (or to) the device.

In some embodiments, the portion of the inner wall 300 that defines the core region 530 defines a helical flow path. That is, the portion of the inner wall 300 that defines the core region 530 may be defined so that the inner wall 300 directs the flow of fluid within the core region 530 in a clockwise or counterclockwise direction. In such an embodiment, the inner wall 300 causes the fluid to flow along a helical, or at least partially helical, path as it flows from the inlet 510 to the outlet 520. In some embodiments, the inner wall 300 defines the flow passage 500 such that there is an uninterrupted line of sight between the inlet 510 and the outlet 520. Alternatively, the inner wall 300 may define the core region 530 such that a line of sight is partially or fully occluded between the inlet and the outlet. The XTS may alter/block the wavefront of an optic/electro-magnetic signal.

In some embodiments, to further facilitate the flow of heat from heat sources 104 enclosed within the internal volume 400, a heat transfer fluid 402 may be included within the internal volume 400. For example, the heat transfer fluid 402 may be included within the internal volume 400 such that it maintains fluid contact with one or more of an inner surface 202 of the outer wall 200, an inner surface 302 of the inner wall 300, and the heat source 104. Alternatively or in addition, the heat transfer fluid 402 may also be in mechanical contact with one or more other component elements which directly or indirectly exchange heat with the inner wall 300 and/or heat source 104 via conductive, convective, and/or radiation heat transfer. The heat transfer fluid 402 may be a fluid specifically designed to optimize thermal heat transfer. Alternatively or in addition, the heat transfer fluid 402 may serve additional functions, such as serving as a propellant, a facilitator of electron transfer, etc. In various embodiments, the heat transfer fluid 402 may correspond to and/or optionally include a foam, a liquid, and/or a gas. When operative with foam and/or liquid, the heat transfer device 100 may or may not include an ullage. In various embodiments, the heat transfer device 100 may include one or more interfaces configured to allow the heat transfer fluids 402 to be selectively and repeatedly drained, refilled, and/or probed. For example, a heat transfer device 100 may include a valve that enables the heat transfer fluid 402 to be drained and/or added to the internal volume 400. In some examples, such as submersible heat transfer devices 100, a fluid may be enclosed where buoyancy-driven flow may be modeled with the Boussinesq Approximation, for example to analyze/understand convective stirring.

As schematically illustrated in FIG. 1, the heat transfer device 100 may optionally include one or more heat transfer structures 600 that extend inwardly from an outer surface 304 of the inner wall 300 and into the core region 530. In various embodiments, individual heat transfer structures 600 may be separate from the inner wall 300, may be component elements of the inner wall 300, or may be portions of the inner wall. In some embodiments, the heat transfer structures 600 may also extend outwardly from the inner surface 302 of the inner wall 300 and into the internal volume 400. For example, individual heat transfer structures 600 may comprise a core portion 602 that extends into the core region 530 from the outer surface 304 of the inner wall 300, and an internal portion 604 that extends into the internal volume 400 from the inner surface 302 of the inner wall 300. The heat transfer structures 600 receive heat from one or more of the inner wall 300, the heat source 104, the heat transfer fluid 402, and/or other component elements which directly or indirectly exchange heat with the inner wall 300 and/or heat source 104 via conductive, convective, and/or radiation heat transfer. For example, in some embodiments one or more of the heat transfer structures 600 may extend through apertures in the inner wall 300 such that an inner portion of the corresponding heat transfer structure 600 is located in the internal volume 400, and the core portion 602 of the heat transfer structure is located in the core region 530. In such embodiments, the internal portion 604 of a heat transfer structure 600 may receive a transfer of heat from a heat source 104 via a heat transfer fluid 402 within the internal volume 400. Alternatively or in addition, a core portion 602 of a heat transfer structure 600 may receive a transfer of heat from a heat source 104 via the inner wall 300. The internal portion 604 may also contain ridges and/or Juglan Genus Ribs (JGR) to further facilitate heat transfer. The heat transfer structures 600 may correspond to and/or optionally include conductive materials such that the received heat is internally conducted across an individual heat transfer structure. Heat is then able to exchange between the heat transfer structures 600 and fluid within the core region 530 of the flow passage 500 by conductive heat transfer. In this way, heat received by a heat transfer structure 600 is conducted across the heat transfer structure 600 and then, as the fluid flows through the core region 530, the heat is transferred from the heat transfer structures 600 and to the fluid. In various embodiments, the heat transfer structures 600 may correspond to, but are not limited to, any combination of pins, fins, rods, walls, surfaces, needles, ridges, or other structures that facilitate heat transfer with the fluid in the core region 530. For example, in an embodiment the heat transfer structures 600 may correspond to a plurality of pins having a cross-sectional rhombus shape.

The heat transfer structures 600 may be shaped and/or positioned to direct fluid flow within the core region 530. In various embodiments, the heat transfer structures 600 may be shaped and/or positioned such that the distance traveled by fluid within the core region 530 is increased and/or turbulence of the fluid flow within the core region 530 is increased. By increasing the length of the flow path and/or the turbulence of the flow of the fluid in the core region 530, the heat transfer structures 600 increase the heat transfer between the fluid and the inner wall 300 and/or heat transfer structures 600. For example, the heat transfer structures 600 may be arranged on the inner wall 300 in a pattern, such as a matrix pattern, a staggered formation, or other arrangement that directs or otherwise affects the flow of fluid through the core region 530. Alternatively or in addition, the heat transfer structures 600 may correspond to and/or optionally include ridge or fin structures extending from the outer surface 304 of the inner wall 300 which are configured to direct the flow of fluid within the core region 530 in a clockwise or counterclockwise direction. In such an embodiment, the heat transfer structures 600 may cause the fluid to flow along a helical, or at least partially helical, path as it flows from the inlet 510 to the outlet 520.

As schematically illustrated in FIG. 1, the outer wall 200 is exposed to environment 102, and protects and/or shields components within the internal volume 400, such as, for example, a heat source 104, from damage from the environment 102. In some embodiments, the outer wall 200 and/or the inner wall 300 includes or optionally comprises a conductive material (e.g., AlSi10Mg) that enables heat to exchange between components in the internal volume 400 and the environment 102. The outer wall 200 defines an external shape of the heat transfer device 100. The shape of the heat transfer device 100 may include curved elements, rectilinear elements, or a combination thereof. For example, the shape of the heat transfer device may include a combination of features from a combination of one or more of a sphere, an ovoid, a barrel, an elliptic, a rectilinear prism, a cylinder, a disc, a prolate spheroid, crescent, arc, arch, fin, fixed surface, and an oblate spheroid.

Figure 6:
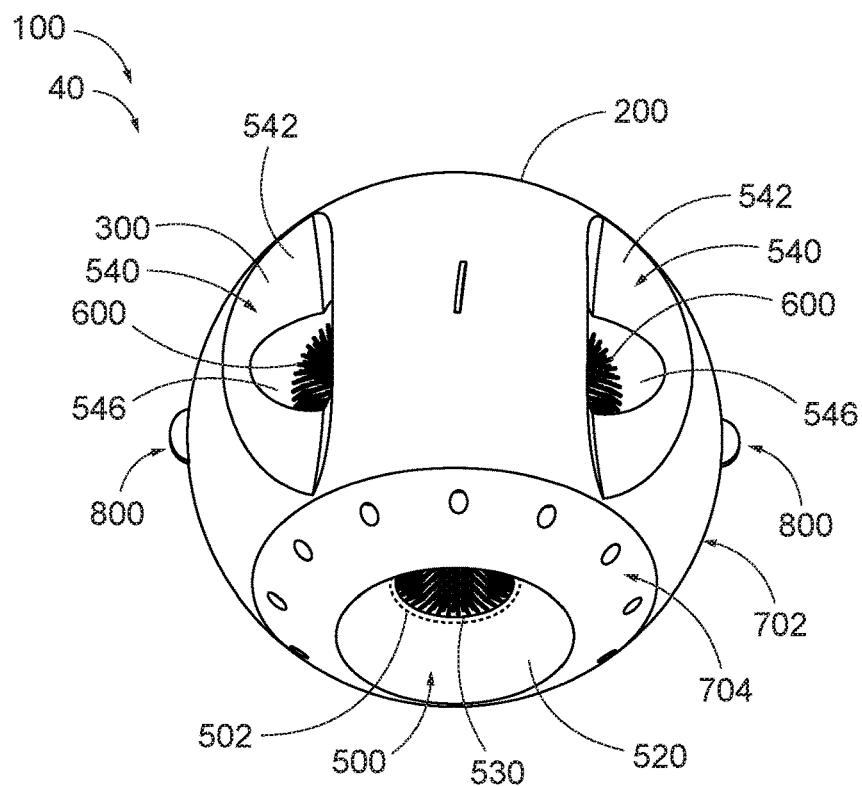
FIG. 6 is an isometric view of an example heat transfer device according to the present disclosure including inlets having a concave vesica pisces shape.
Figure 7:
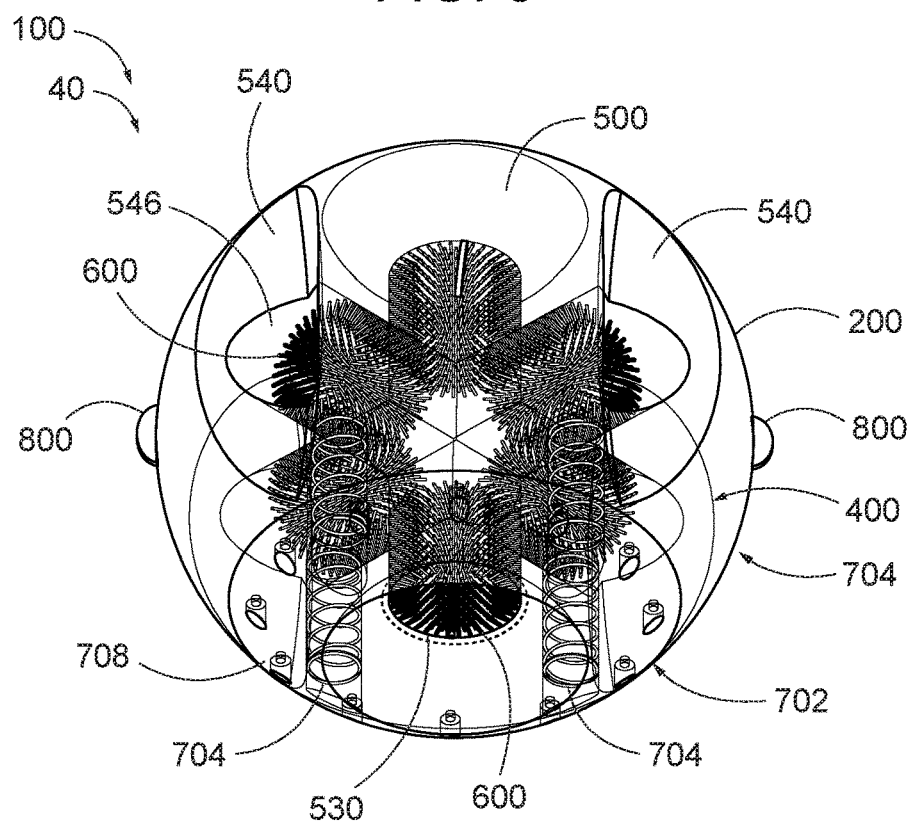
FIG. 7 is an isometric cross section of the example heat transfer device of FIG. 6.

As shown in FIG. 1, the inner wall 300 defines flow passage 500, which comprises inlet 510, outlet 520, and core region 530. The inlet 510 comprises an outer opening 512 that is adjacent to and/or adjoins with the outer wall 200 and an inner opening 514 that is adjacent to the core region 530. In some embodiments, a diameter and/or area of the outer opening 512 is greater than a diameter of the inner opening 514. For example, the inlet 510 may completely or partially correspond to a funnel (e.g., a concave funnel) that allows a large amount of fluid from the environment 102 to be directed into the core region 530. In this way, the inlet 510 is able to capture a larger amount of fluid flow than the core region 530 would independently capture. Additionally, this inlet 510 shape may force the fluid to have a greater velocity within core region 530, which would increase a potential for turbulent flow within core region 530, ostensibly improving heat transfer with inner wall 300 and/or with heat transfer structures 600. The shape of the inlet 510 may vary depending on the expected environment 102 of a corresponding heat transfer device 100, a heat source 104 associated with the corresponding heat transfer device 100, or other considerations. For example, FIGS. 2-5 illustrate example embodiments of heat transfer devices 100 having inlets 510 with a generally circular shape, while FIGS. 6-7 illustrate example embodiments of heat transfer devices 100 having inlets 510 with a generally concave vesica pisces shape.

FIG. 1 further illustrates the inner wall 300 defining outlet 520. The outlet 520 is configured to allow fluid to flow out of the flow passage 500. In some embodiments, the outlet is configured to exhaust the fluid and any heat associated with the fluid from the heat transfer device 100. For example, the outlet 520 may be configured to allow fluid and any heat associated with the fluid to flow through the outlet 520 and into the environment 102, and/or into an external body 106. In some embodiments, one or more of the inlet 510 and the outlet 520 may include perforations 502 configured to receive boundary layer flow of the fluid as it enters and/or exits the flow passage 500: as an example, facilitating Boundary Layer Ingestion (BLI), whereby a wall may, in some cases, separate perforations 502 from heat source(s) 104.

As illustrated in FIG. 1, heat transfer device 100 optionally may include one or more additional flow passages 540. Individual additional flow passages 540 may be defined by inner wall 300 or an additional inner wall 310. For example, where an additional flow passage 540 is in fluid communication with the flow passage 500, the additional flow passage 540 may be defined by the inner wall 300. Alternatively, if an additional flow passage 540 is not in fluid communication with the flow passage 500, the additional flow passage 540 may be defined by an additional inner wall 310. Individual additional flow passages 540 may be defined so as to include an additional inlet 542 configured to receive a fluid from the environment 102, an additional outlet 544 configured to exhaust the fluid from the additional flow passage 540 and an additional core region 546 extending between and in fluid communication with the additional inlet 542 and the additional outlet 544. Similar to the flow passage 500, the walls defining an individual additional flow passage 540 may correspond to and/or optionally include a heat transfer material to facilitate such a transfer of heat between the heat transfer device 100 and fluid flowing through the individual additional flow passages 540. Alternatively, or in addition, heat transfer structures 600 may extend into the additional flow passage 540 from the inner wall defining the additional flow passage 540.

In some embodiments, at least one of the inner wall 300 and the outer wall 200 are configured to allow selective access to the internal volume 400. For example, the outer wall may include a closeable aperture 306 that may be selectively opened to allow access to the internal volume 400, whereby a wall may, in some cases, partition one or more additional, internally nested volumes. In this way, a user may selectively install, remove, fix, or adjust the heat source 104 and/or other components located within or affixed to the internal volume. Alternatively or in addition, the heat transfer device may include a first body 702 and a second body 704 that may be selectively and/or repeatedly uncoupled to allow access to the internal volume 400 and then selectively and/or repeatedly recoupled, such as may be performed without permanent damage to the heat transfer device.

As shown in FIG. 1, each of the first body 702 and the second body 704 may include portions of the outer wall 200 and the inner wall 300. The first body 702 and the second body 704 may be mechanically coupled to one another by one or more fastener mechanisms 706 that allow the first body 702 and the second body 704 to be selectively uncoupled and recoupled without permanent damage. Example fastener mechanisms 706 may include, but are not limited to, magnetic fasteners, ties, threaded fasteners, snap fasteners, pins, retaining rings, rivets, bands, pegs, clips, buttons, clasps, flange, and/or clamps. In some embodiments, the fastener mechanisms 706 may include rubberized O-ring fastener seals—including securely embedded variants, referred to as Gibbous O-ring Layering (GOL)—or other sealing means to ensure that the coupling between the first body 702 and the second body 704 is airtight and/or waterproof. Such seal may be strong so as to survive transients of pressure and/or temperature regimes and may or may not be designed to leak/rupture/burst at one or more target/threshold pressures/temperatures/stress-loading. In some cases, rupture of the seal may directly cause or unleash a chain of events which alter, disfigure, damage and/or compromise the integrity of other devices, including electronics and/or the heat generating source, affixed to the XTS structure. The device may alternatively have a permeable first body 702 and second body 704, including for example cage structure with constant or varying-size orifices. Such cage may in some cases provide the function of a faraday cage and/or further facilitate heat transfer. The heat transfer device 100 may (or may not) operate in a cryogenic environment and/or be stored in a cryogenic environment. In such environments, the heating of the heat transfer device 100 may in some cases de-ice the heat transfer device 100. The device may be designed for controlled deformation/ buckling, for example via selective-stiffening/disparate-reinforcing, at target temperature/pressure/stress-loading thresholds. The heat transfer device 100 may be designed for non-holonomic structural deformation.

In some embodiments, each of the first body 702 and the second body 704 may include a flange 708, where the fastener mechanisms 706 mechanically couple the flange of the first body to the flange of the second body. The heat transfer device 100 is in a closed configuration when the fastener mechanisms 706 mechanically couple the first body 702 and the second body 704, and the heat transfer device 100 is in an open configuration when the fastener mechanisms 706 do not mechanically couple the first body 702 and the second body 704 and/or when the first body 702 and the second body 704 are physically separated, or spaced-apart, from one another. According to the present disclosure, the flange 708 may extend from the outer walls 200 of the first body 702 and the second body 704 into the environment 102 as illustrated in FIGS. 2-5, and/or may extend from the outer walls 200 of the first body 702 and the second body 704 into the internal volume 400 as illustrated in FIGS. 6-7. As shown in FIGS. 2-5, in some embodiments the one or more of the flanges of the first body 702 and the second body 704 may have a sinusoidal outer rim surface.

In some embodiments, the first body 702 and the second body 704 may also be connected by at least one compression spring 710 that biases the first body 702 away from the second body 704. In this way, when the heat transfer device 100 is in a closed configuration, the fastener mechanisms 706 overcome the bias of the at least one compression spring 710 and mechanically couple the first body 702 and the second body 704 to one another. For example, the first body 702 and the second body 704 may be coupled by a compression spring. Thus, when the heat transfer device is in an open configuration, the at least one compression spring 710 biases the first body 702 and the second body 704 so that they become separated and the internal volume 400 is accessible.

As further illustrated in FIG. 1, heat transfer devices 100 optionally may include one or more vortex generators 800 extending into the environment 102 from the outer surface 204 of the outer wall 200. The vortex generators 800 may be configured to generate a trailing vortex when the fluid from the environment 102 flows across them. These trailing vortexes create a low pressure region that can help to draw airflow through one of the inlet 510 and/or an additional inlet 542 and into a corresponding core region 530 and/or additional core region 546. Individual vortex generators 800 may correspond to bi-directional vortex generators that are configured to generate a trailing vortex when fluid flows across the individual vortex generators from a plurality of directions.

Figure 11:
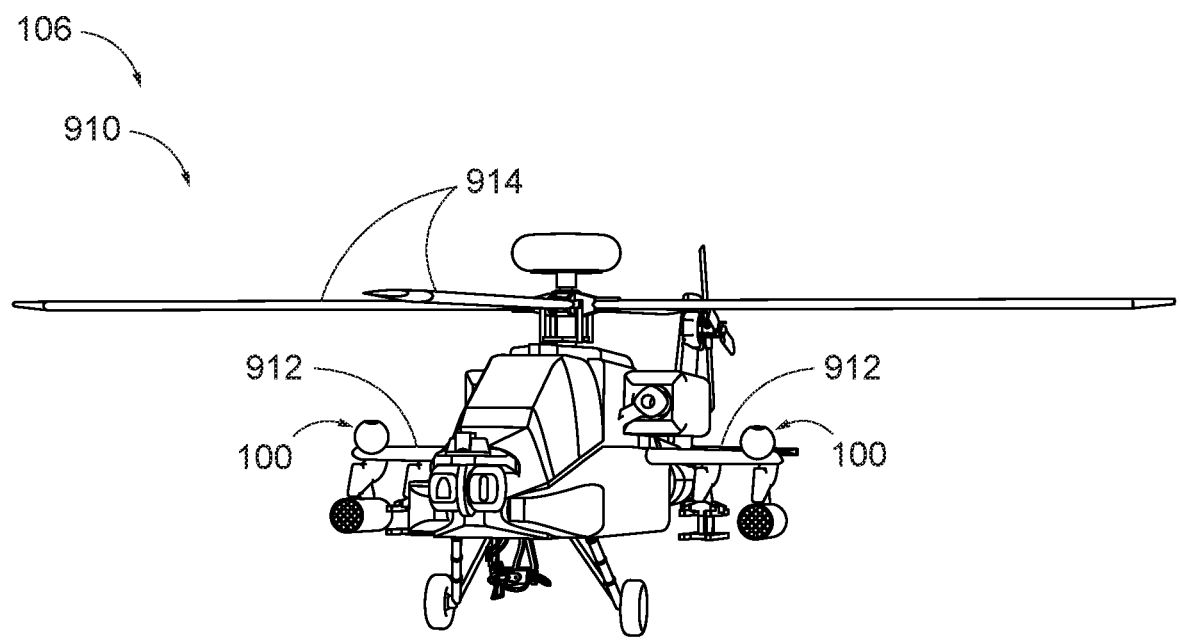
FIG. 11 is an isometric view of a rotorcraft having multiple heat transfer devices operatively coupled thereto according to the present disclosure.
Figure 12:
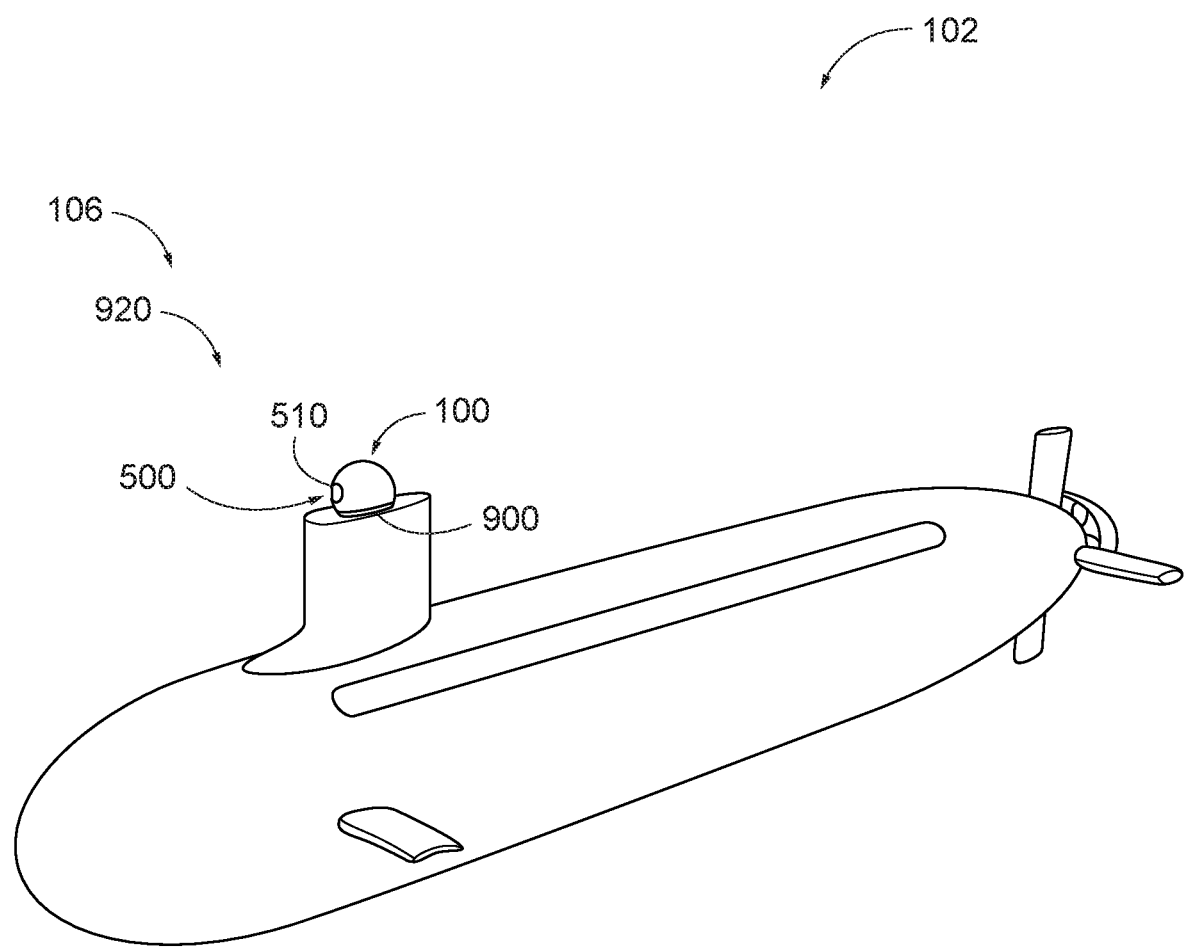
FIG. 12 is an isometric view of an underwater vehicle having a heat transfer device operatively coupled thereto according to the present disclosure.
Figure 13:
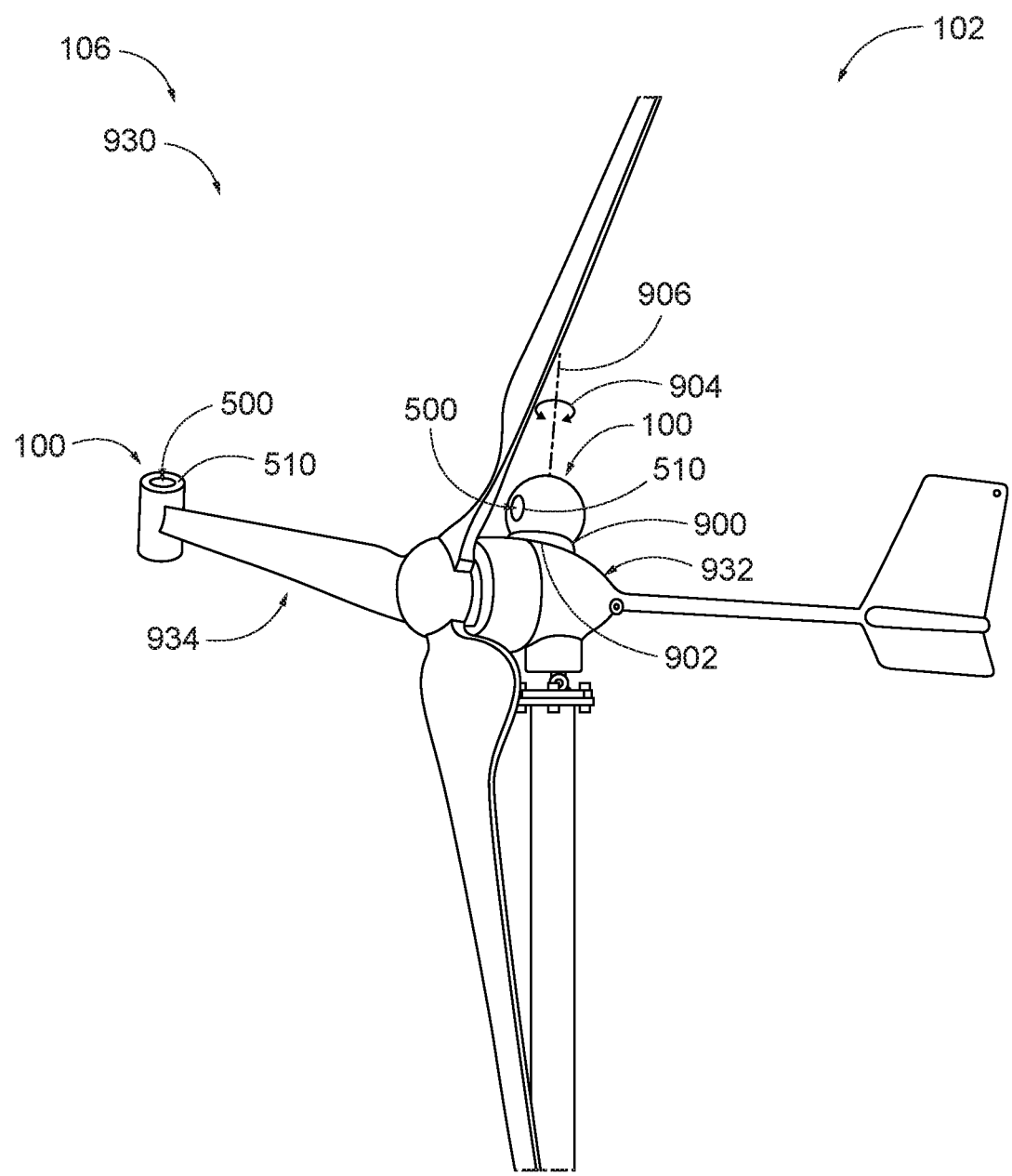
FIG. 13 is an isometric view of a wind turbine having multiple heat transfer devices operatively coupled thereto according to the present disclosure.

As shown in FIGS. 11-13, in some embodiments the heat transfer devices 100 may be a component element that is operationally coupled to an external body 106, such as an aircraft, watercraft, spacecraft, windmill, etc., and configured to cool a heat source 104 associated with the external body 106. For example, a heat transfer device 100 according to the present disclosure may be attached to a stub wing of a rotorcraft and may enclose an electronic component of the rotorcraft, such as a radar/honing device. In such an example embodiment, downwash airflow from the rotors of the rotorcraft (or from other vehicles/machines), wind due to natural air currents, and/or wind due to movement of the rotorcraft may cause air to flow through the flow passage 500, cooling the radar device. Alternatively, a heat transfer device 100 may be coupled to a rotor blade of a rotorcraft. Example rotorcraft include, but are not limited to experimental rotorcraft/vehicles, futuristic vehicles, including S-97 Raider as well as rotorcraft with axi-symmetric/near-axi-symmetric rotors (e.g., V-280) and even tailless/near-tailless rotorcraft (e.g., interpolating/extrapolating the design space between the XR-8 and Cora, Surefly, Lilium Jet, Vahana, etc.), and also theatre-proven/modified theatre-proven vehicles, such as the AH-64 Apache, Westland Lynx, RAH-66 Comanche, V-22 Osprey, CH-47 Chinook, CH-53E Super Stallion, MH-6 Little Bird, UH-1 Iroquois, UH-60, VH-3D, and VH-60N. In such embodiments, the rotation of the rotor blade may cause air to flow into the inlet 510. Other examples of external bodies 106 to which the heat transfer devices 100 can be coupled include but are not limited to vehicles, trains, hyperloops, windmills, communication towers, antenna, wind turbines, drone aircraft, aircraft, and spacecraft. Additionally, heat transfer devices 100 may be coupled to watercraft, submarines, torpedo interceptors, supercavitation devices, etc. In such embodiments the fluid flowing through the flow passage 500 corresponds to saline/freshwater in aqueous states. Slush, snow, ice particulates, and vapor may also flow through the heat transfer device 100. Coupling to a vehicle may in some cases be achieved via a tether. In some instances, a tether or another chord may be threaded through the core region 530. Multiple devices may be coupled to a machine/vehicle, in some cases with symmetry about a geometric plane and/or in radial symmetry. Multiple devices may be coupled to a machine/vehicle, in some cases with symmetry about a geometric plane and/or in radial symmetry. One or more devices may bisect/intersect geometric planes of symmetry. Multiple heat transfer devices 100 may be tethered/affixed to each other, including heat transfer devices 100 of identically specified dimensions as well as devices of varied dimension. As an example, a large heat transfer device 100 may be affixed to a smaller heat transfer device, and a large heat transfer device 100 may be affixed (daisy-chained) to a series of progressively smaller (i.e., affine) heat transfer devices 100 (e.g., a Mandelbrot formation). The heat transfer device 100 is not required to be coupled to the vehicle at all times; the heat transfer device 100 may, for example, have neutral buoyancy relative to a submersible, an aircraft or a spacecraft. The device may separate/eject from the vehicle, as an example during over-heating. In such event, systems and/or people (e.g., pilots) may, in some cases, ensure the vehicle is not in flight above a manned territory prior to the device's tumbling to the ground. Heat may be drawn to the heat transfer device 100 from sources outside the heat transfer device 100, for example, from a vehicle attached by tether.

As shown in FIG. 1, in such embodiments the heat transfer device 100 includes a coupling element 900 that mechanically couples the heat transfer device 100 to an attachment surface 112 of an external body 106. The coupling element 900 may be configured to allow the heat transfer device 100 to be repeatedly coupled to and uncoupled from the attachment surface 112 without damage. Additionally, in some embodiments the coupling element 900 may allow the heat transfer device 100 to be selectively coupled to and uncoupled from multiple different attachment surfaces of the external body 106, and/or attachment surfaces on other external bodies, including adapters in between. In this way, a heat transfer device 100 may be uncoupled from a first attachment surface on the body of an aircraft, and then coupled to a second attachment surface on a different aircraft. In some embodiments, the coupling element 900 is configured to allow the heat transfer device 100 to rotate in relation to the attachment surface 112 when the coupling element 900 is coupled to the attachment surface 112, and/or in relation to other surfaces, vehicles, devices, or global coordinate schemas. For example, the coupling element 900 may include a pivot or joint 902 that allows the heat transfer device 100 to pivot, move, or rotate in one or more degrees of freedom relative to the attachment surface 112. For example, the coupling element 900 may correspond to and/or optionally include one or more gimbals. In some embodiments, the fluid may exert a force on the inlet 510 and/or additional inlet 542 as it enters the flow passage 500 and/or additional flow passage 540. This force may then cause the heat transfer device 100 to pivot, move, or rotate in relation to the attachment surface 112. In this way, fluid entering into flow passage 500 and/or additional flow passage 540 may orient the heat transfer device 100.

According to the present disclosure, one or more component elements of heat transfer device 100 may be constructed via additive manufacturing. For example, in various embodiments according to the present disclosure, one or more portions of the outer wall 200, inner wall 300, heat transfer structures 600, and or other components of the heat transfer device 100 may be additively manufactured. Inter alia additive manufacturing methods and printers include, but are not limited to, VAT photopolymerization, powder bed fusion, binder jetting, bronze infusion/infiltration, material jetting, sheet lamination, material extrusion, directed energy deposition, directed metal laser sintering, direct metal printing, electron beam additive manufacturing, electron beam melting, electron beam powder bed, fused deposition modeling, indirect power bed, laser cladding technology, laser deposition technology, laser deposition welding, laser deposition welding with integrated milling, laser engineering net shape, laser freeform manufacturing technology, laser metal deposition-powder, laser metal deposition-wire, laser powder bed, laser puddle deposition, laser repair technology, powder directed energy deposition, stereolithography, selective laser melting, selective laser sintering, small puddle deposition, atomic diffusion additive manufacturing, Big Area Additive Manufacturing, Bound Metal Deposition, composite-based additive manufacturing, digital light processing, digital light synthesis, gel dispensing printing, high-speed sintering, laminated object manufacturing, multi-jet fusion, Quantum & Nano-pico-femto-atto-scale Manufacturing (QUN), Rapid Plasma Deposition, Selective Deposition Lamination, Single-Pass Jetting, Ultrasonic Additive Manufacturing, Ytterbium In-situ Manufacturing (YIM), as well as other mechanical adding machines and vivat-crescat-floreat hybrid processes thereof. For example, powder may be formed as collected waste powder or produced powder from Electrical Discharge Machining (EDM) processes.

Potential additive manufacturing materials include metals such as steel, stainless steel, Elgiloy®, titanium, copper, bronze, Hastalloy, zinc, aluminum, nickel, and alloys thereof, including but not limited to IN600, IN625, IN718, Ti-6Al-4V, AlSi10Mg, SS316, Monel, Monel K500, Copper, Ti-5553, Ti-6Al-6V-2Sn, Ti-6242, Maraging Steel MSI 18, Mar 300, 316L, 17-4, 15-4, Cobalt Chrome SP2, Zircalloy, Niobium (NB), Ti—Al—NB, Zirconium, Molybdenum, Vitallium, Vanadium, Ti-6Al-4V ELI, Nickel Alloy HX, Ni—Ti-20Hf, gold (au), silver (ag), as well as plastics, polymers and/or elastomers, including Acrylonitile Butadiene Styrene (ABS), Polylactic acid (PLA), Polyvinyle Chloride, PTFE, Acetal, Delrin®, Polyvinyl alcohol, and Polycarbonate, and others including ULTEM®/PPSF/PPSU, Kel-F, Kevlar®, Nylon, Nomex®, fabrics, Polybenzimidazole (PBI), glass, and Carbon Composite, Boron Nitride (BN), as well as thermoplastics such as Polyamide (PA), Polyphenylene Sulfide (PPS), Polyether Ether Ketone (PEEK), Poly-Ether-Ketone-Ketone (PEKK), Polyetherimide (PEI), Polyphenylsulfone (PPSU), Polyethersulfone (PES), Thermoplastic Polyimide (TPI), liquid crystalline polymer (LCP), polyamide-imide (PAI), or the like. Though elastic materials are mentioned, for instantiations which may include adaptability/malleability, metallics may also be adaptable/malleable. Heat transfer devices 100 disclosed herein may also be partially or completely formed of, or may otherwise include, functionally gradient materials. In one example, the component elements of heat transfer device 100 optionally may be formed by altering the blending of deposited additively manufactured material such that functionally gradient material properties may be achieved, including varying the Coefficient of Thermal Expansion (CTE).

Outer bodies 702 and 704 may be fully conducive, partially conducive, or unconducive with Non-Destructive Inspection (NDI), Non-Destructive Testing (NDT), and/or Non-Destructive Evaluation (NDE), by inter alia methods of penetrant inspection, X-Ray, ultrasonic inspection, computed tomography (CT) scanning, surface smoothness testing, hardness testing, and/or radiography. Multiple probes may or may not be used in unison for a single NDI/NDT/NDE inspection, and multiple NDI/NDT/NDE inspections may or may not be conducted in unison.

The device's surface may have a smooth/smoothed surface. It may or may not have a mirror or a supermirror finish. It may have a detectable backscatter coefficient, an undetectable backscatter coefficient or combinations thereof depending upon locations on the device's surface.

Turning now to FIGS. 2-7, illustrative, non-exclusive examples of heat transfer devices 100 are illustrated. Where appropriate, the reference numerals from the schematic illustrations of FIG. 1 are used to designate corresponding parts of the examples of FIGS. 2-7; however, the examples of FIGS. 2-7 are non-exclusive and do not limit heat transfer devices 100 to the illustrated embodiments of FIGS. 2-7. That is, heat transfer devices 100 are not limited to the specific embodiments of FIGS. 2-7, and heat transfer devices 100 may incorporate any number of the various aspects, configurations, characteristics, properties, etc. of heat transfer devices 100 that are illustrated in and discussed with reference to the schematic representation of FIG. 1 and/or the embodiments of FIGS. 2-7 as well as variations thereof, without requiring the inclusion of all such aspects, configurations, characteristics, properties, etc. For the purpose of brevity, each previously discussed component, part, portion, aspect, region, etc. or variants thereof may not be discussed, illustrated, and/or labeled again with respect to the examples of FIGS. 2-7; however, it is within the scope of the present disclosure that the previously discussed features, variants, etc. may be utilized with the examples of FIGS. 2-7.

Figure 2:
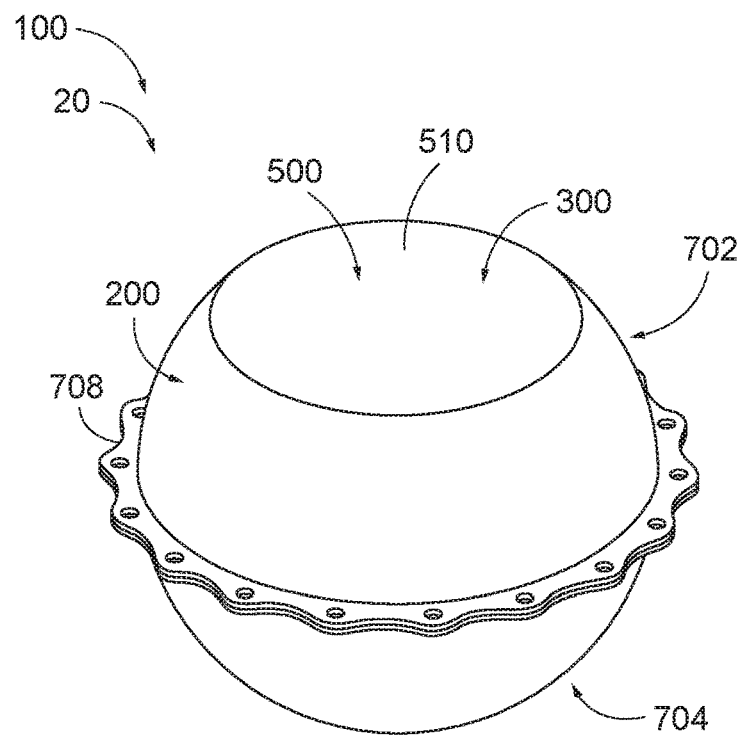
FIG. 2 is an isometric view of an example heat transfer device according to the present disclosure having a single flow passage defined by an inner wall.
Figure 3:
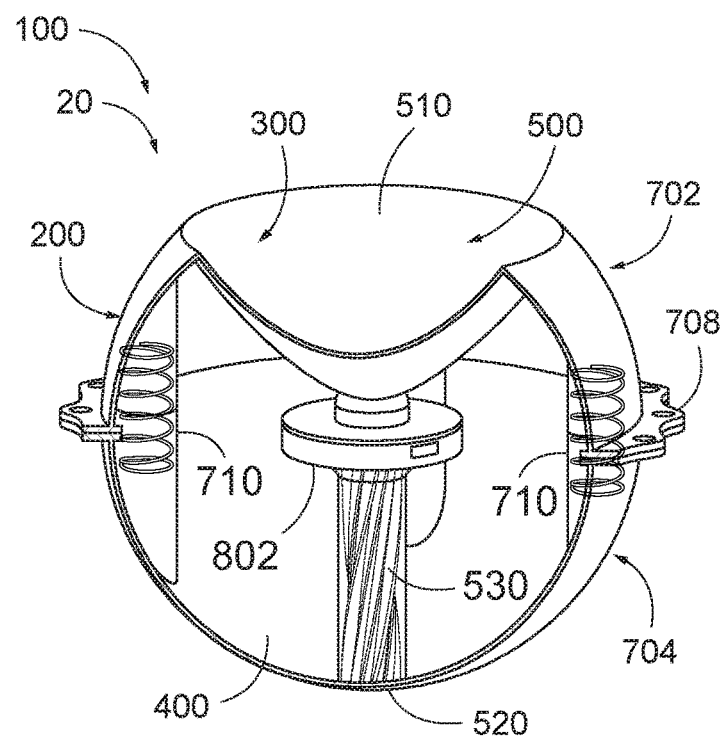
FIG. 3 is an isometric cross section of the example heat transfer device of FIG. 2.

FIGS. 2-3 illustrate an example, device 20, of a heat transfer device 100 having a single flow passage. FIG. 2 illustrates an isometric view of device 20. FIG. 2 shows device 20 as including an outer wall 200 that defines a generally spherical shape of the device 20, and a single flow passage 500 defined by an inner wall 300. FIG. 2 further shows the flow passage 500 as having a concave funnel-shaped inlet 510. FIG. 2 further shows the device 20 having a first body 702 and a second body 704 coupled together with a sinusoidal flange 708.

FIG. 3 is an isometric cross section of device 20. FIG. 3 shows device 20 as further including an internal volume 400 defined between the inner wall 300 and the outer wall 200. FIG. 3 illustrates a heat transfer apparatus 802 as being located within the internal volume 400. The heat transfer apparatus 802 may be positioned proximate to a heat source 104, and may be configured to draw excess heat away from the heat source 104. In some embodiments, the heat transfer apparatus 802 may correspond to a thermal wafer. FIG. 3 further shows the flow passage 500 as having a concave funnel-shaped inlet 510 through which fluid can enter the device 20, an outlet 520 through which the fluid can exit the device 20, and a core region 530 through which the fluid can flow from the inlet 510 to the outlet 520. FIG. 3 illustrates the inner wall 300 defining the core region 530 such that fluid flowing through the core region 530 follows a helical flow path. FIG. 3 also shows the device 20 having a first body 702 and a second body 704 coupled together with a sinusoidal flange 708 and a plurality of compression springs 710.

Figure 4:
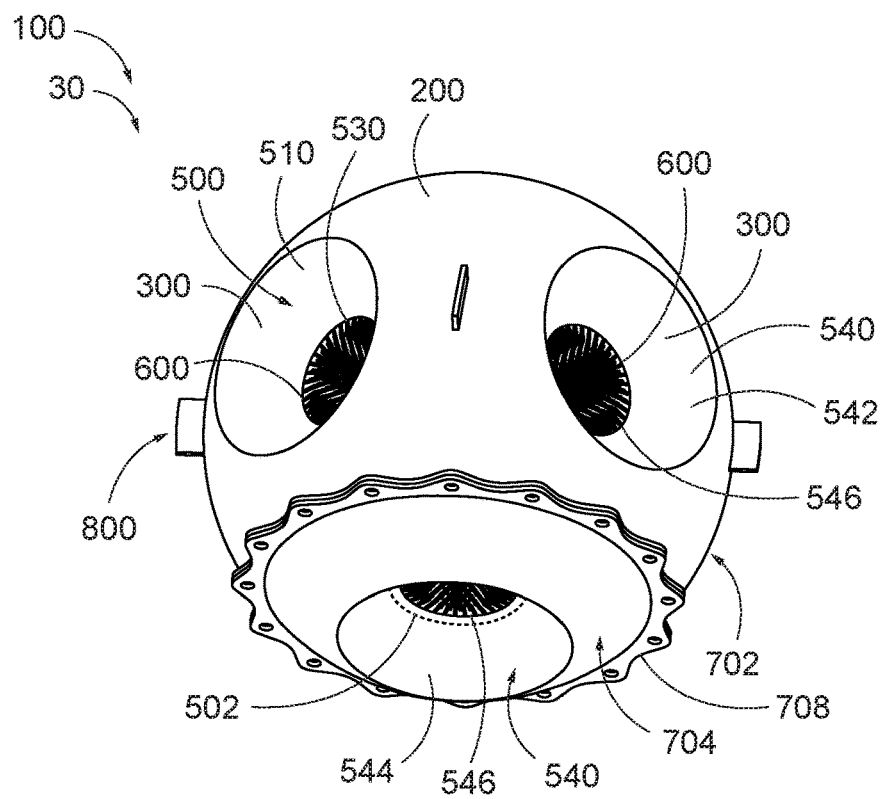
FIG. 4 is an isometric view of an example heat transfer device according to the present disclosure having multiple additional flow passages.
Figure 5:
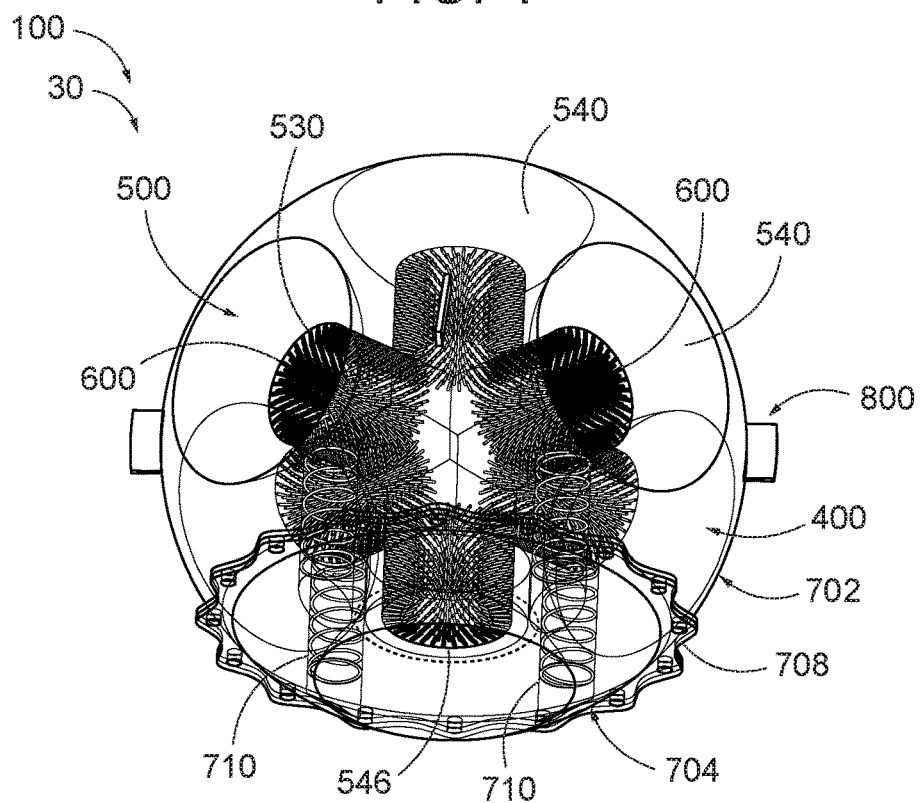
FIG. 5 is an isometric cross section of the example heat transfer device of FIG. 4.

FIGS. 4-5 show an example, device 30, of a heat transfer device 100 having multiple flow passages. FIG. 4 is an isometric view of device 30. FIG. 4 shows device 30 as including an outer wall 200 that defines a generally spherical shape of the device 30, a flow passage 500, and multiple additional flow passages 540, wherein each of the flow passage 500 and the additional flow passages 540 are in fluid connection and defined by an inner wall 300. FIG. 4 further shows the flow passage 500 and additional flow passages 540 as having a concave funnel-shaped inlet 510 and additional inlet 542. Each of the flow passage 500 and additional flow passages 540 is also shown as having a corresponding core region 530, 546 that includes a plurality of heat transfer structures 600 extending inward from the inner wall 300. FIG. 4 also illustrates an additional outlet 544 having perforations 502 that ingest the boundary layer of the fluid as it exits the device 30. FIG. 4 further shows the device 30 having a first body 702 and a second body 704 coupled together with a sinusoidal flange 708. FIG. 4 also shows multiple vortex generators 800 extending into the environment from the outer wall 200.

FIG. 5 is an isometric cross section of device 30. FIG. 5 shows device 30 as further including an internal volume 400 defined between the inner wall 300 and the outer wall 200. FIG. 5 also shows the first body 702 and the second body 704 of device 30 coupled together with the sinusoidal flange 708 and a plurality of compression springs 710.

FIGS. 6-7 illustrate an example, device 40, of a heat transfer device 100 that includes multiple flow passages and includes inlets having a concave vesica pisces shape. FIG. 6 is an isometric view of device 40. FIG. 6 shows device 40 as including an outer wall 200 that defines a generally spherical shape of the device 40, a flow passage 500, and multiple additional flow passages 540, wherein each of the flow passage 500 and the additional flow passages 540 are in fluid connection and defined by the inner wall 300. FIG. 6 further shows the additional flow passages 540 as having concave vesica pisces shaped additional inlets 542. Each of the flow passage 500 and additional flow passages 540 is also shown as having a corresponding core region 530, 546 that includes a plurality of heat transfer structures 600 extending inward from the inner wall 300. FIG. 6 also illustrates an outlet 520 having perforations 502 that ingest the boundary layer of the fluid as it exits the device 40. FIG. 6 further shows the device 40 having a first body 702 and a second body 704. FIG. 6 also shows multiple vortex generators 800 extending into the environment from the outer wall 200.

FIG. 7 is an isometric cross section of device 40. FIG. 7 shows device 40 as further including an internal volume 400 defined between the inner wall 300 and the outer wall 200. FIG. 7 also shows the first body 702 and the second body 704 of the device 40 coupled together with an internal flange 708 and a plurality of compression springs 710. FIG. 7 also shows multiple vortex generators 800 extending into the environment from the outer wall 200.

Figure 8:
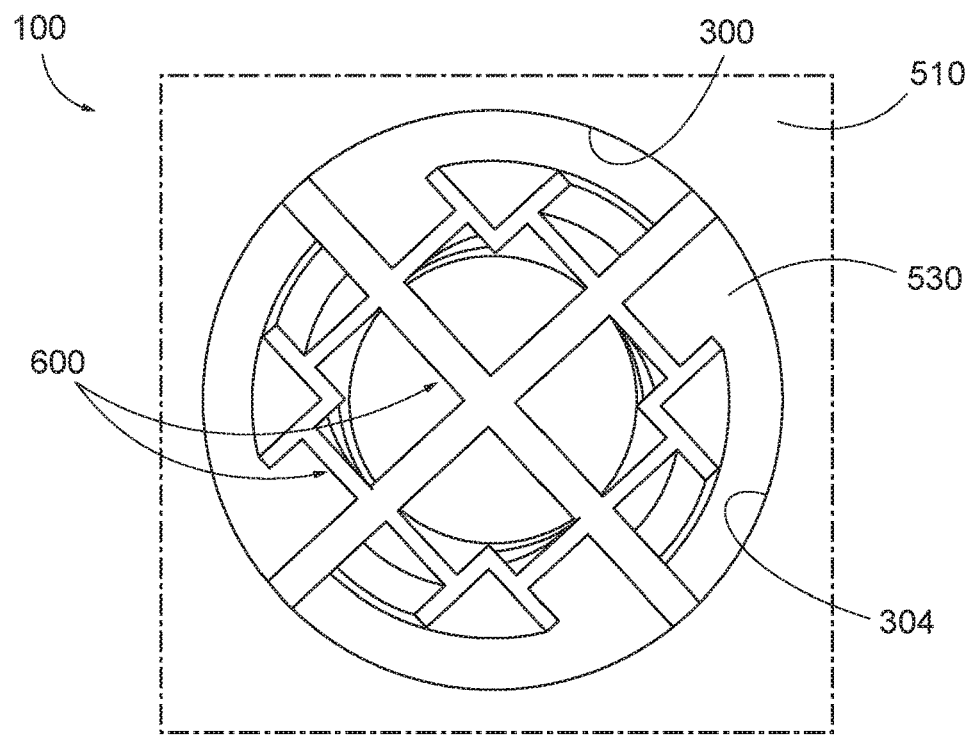
FIG. 8 is a top view of an example core region according to the present disclosure having lattice heat transfer structures.
Figure 9:
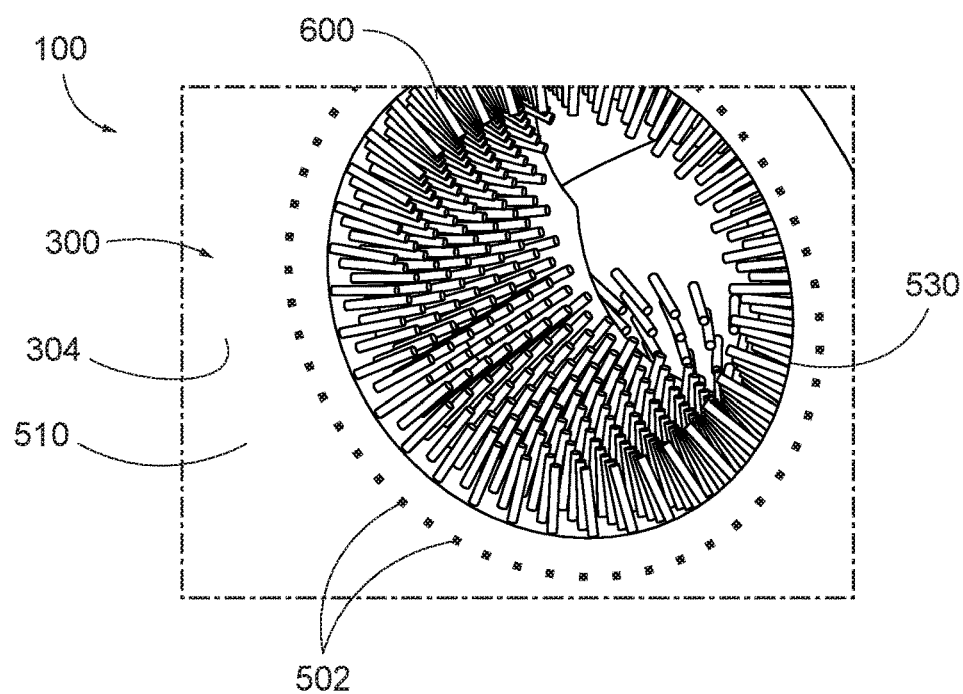
FIG. 9 is a top view of an example core region according to the present disclosure having pin heat transfer structures.

FIGS. 8-9 illustrate example core regions 530 of heat transfer devices 100 according to the present disclosure. FIG. 8 is a top view of a core region 530 of a heat transfer device 100 having lattice heat transfer structures according to the present disclosure. Specifically, FIG. 8 shows an inlet 510 and the core region 530 of heat transfer device 100 that is defined by an inner wall 300 of the heat transfer device 100. FIG. 8 further shows a lattice of heat transfer structures 600 as extending into the core region 530 from an outer surface 304 of the inner wall 300. FIG. 9 is a top view of a core region 530 of a heat transfer device 100 having pin heat transfer structures according to the present disclosure. FIG. 9 illustrates an inlet 510 and the core region 530 of heat transfer device 100 that is defined by an inner wall 300 of the heat transfer device 100. The inlet 510 is illustrated as including a plurality of perforations 502 that ingest boundary-layer airflow as a fluid flows through the inlet 510 and into the core region 530. Additionally, FIG. 9 shows a plurality of pin heat transfer structures 600 as extending into the core region 530 from an outer surface 304 of the inner wall 300. The pin heat transfer structures 600 are arranged in a staggered formation.

Figure 10:
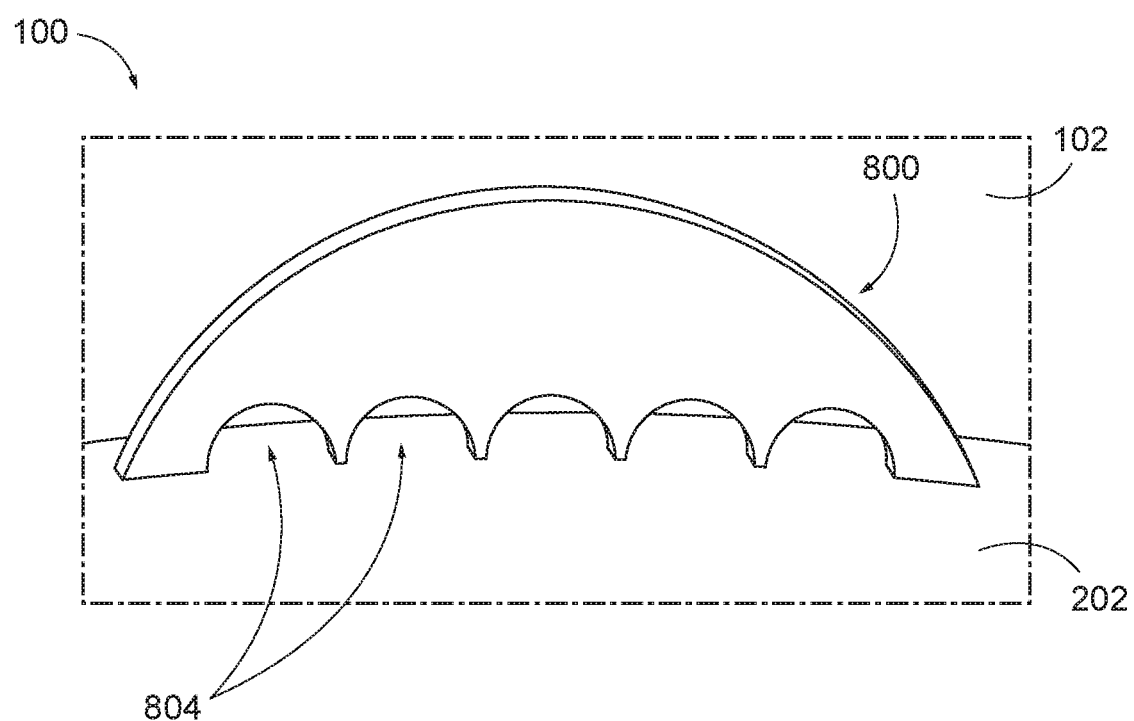
FIG. 10 is an isometric view of an example vortex generator according to the present disclosure.

FIG. 10 is an isometric view of an example vortex generator according to the present disclosure. FIG. 10 illustrates an example vortex generator 800 extending into environment 102 from the outer surface 202 of the outer wall 200. The vortex generator 800 illustrated in FIG. 10 further includes a plurality of staggered, arched cutouts 804. The cutouts 804 are configured to generate a trailing vortex when fluid flows across the example vortex generator 800 from a plurality of directions.

FIGS. 11-13 are examples of heat transfer devices operatively coupled to external bodies according to the present disclosure. For example, FIG. 11 is an isometric view of an example external body 106 operatively coupled to multiple heat transfer devices 100, where the external body corresponds to a rotorcraft 910. FIG. 11 shows the heat transfer devices 100 as being attached to a stub wing 912 of the rotorcraft 910. However, in other embodiments the heat transfer devices 100 may be attached to other surfaces of the rotorcraft 910, such as the rotor blades 914, the fuselage, the main body, etc. In FIG. 11, the heat transfer device 100 is affixed to and cools an electronic component of the rotorcraft 910, such as a radar device. In this depicted example embodiment, downwash airflow from the rotor blades 914 of the rotorcraft 910, downwash of other vehicles/machines, wind due to natural air currents, and/or wind due to movement of the rotorcraft 910 causes air to flow through the heat transfer device 100, cooling the radar device.

FIG. 12 is an isometric view of a heat transfer device operatively coupled to an underwater vehicle according to the present disclosure. Specifically, FIG. 12 shows an example embodiment in which a heat transfer device 100 is operatively coupled to an external body 106, where the external body corresponds to a submarine 920. FIG. 12 shows the heat transfer device 100 as being attached to a body of the submarine 920 via a coupling element 900. Thus, as the submarine 920 moves through the water in its environment 102, the water flows through the flow passage 500 via the inlet 510. In this way, as the water flows through the flow passage 500, heat from a heat source encased by the heat transfer device 100 is transferred into the water and exhausted from the flow passage 500 and into the environment 102.

FIG. 13 is an isometric view of heat transfer devices operatively coupled to a wind turbine according to the present disclosure. FIG. 13 shows an example embodiment where multiple heat transfer devices 100 are operatively coupled to an external body 106, where the external body corresponds to a wind turbine 930. FIG. 13 shows the heat transfer devices 100 as being attached to a body of the wind turbine 930. Specifically, FIG. 13 shows a first heat transfer device 100 coupled to a generator body 932 of the wind turbine 930 via a coupling element 900. In this way, as wind in environment 102 flows past the blades 934 of the wind turbine 930, the first heat transfer device 100 is configured to capture some of the wind via the inlet 510 of the first heat transfer device 100, causing the wind to flow through its corresponding flow passage 500 and subsequently cooling one or more heat sources 104 enclosed by the first heat transfer device 100.

FIG. 13 further depicts coupling element 900 as including a pivot or joint 902 that allows the heat transfer device 100 to pivot, move, or rotate/tilt in one or more degrees of freedom relative to the wind turbine 930. For example, as wind in environment 102 enters the inlet 510 and the inner wall that forms the inlet 510 directs the wind inward or otherwise contacts the heat transfer device, the wind imparts and equal and opposite force on the inner wall of the inlet 510 or another surface of the device. Where the force imparted by the wind is stronger on one side of the surface than the other, the pivot or joint 902 may allow the heat transfer device to pivot until the forces imparted on each side are more balanced. More specifically, the orienting force received by surfaces/fins causes the heat transfer device to rotate (as indicated at 904) around an axis of rotation 906 of the heat transfer device 100.

Additionally, FIG. 13 illustrates a second heat transfer device 100 coupled to a blade 934 of the wind turbine 930. As the flow of wind in environment 102 causes the blades 934 of the wind turbine 930 to rotate, the movement of the second heat transfer device 100 causes air to flow into the flow passage 500 via the inlet 510.

Figure 14:
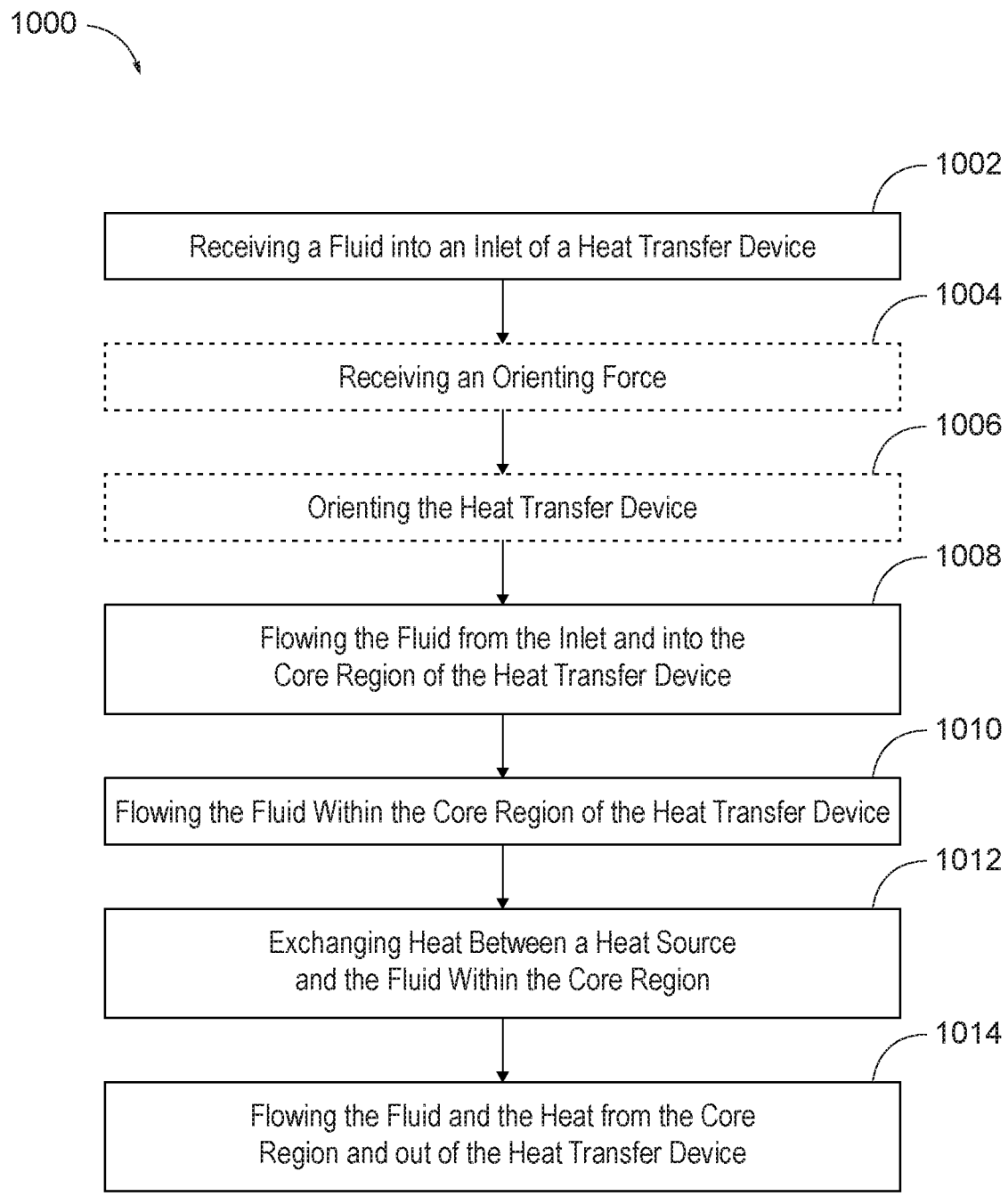
FIG. 14 is a flowchart schematically representing methods for enclosing a heat source and facilitating convective heat transfer from the heat source according to the present disclosure.
Figure 15:
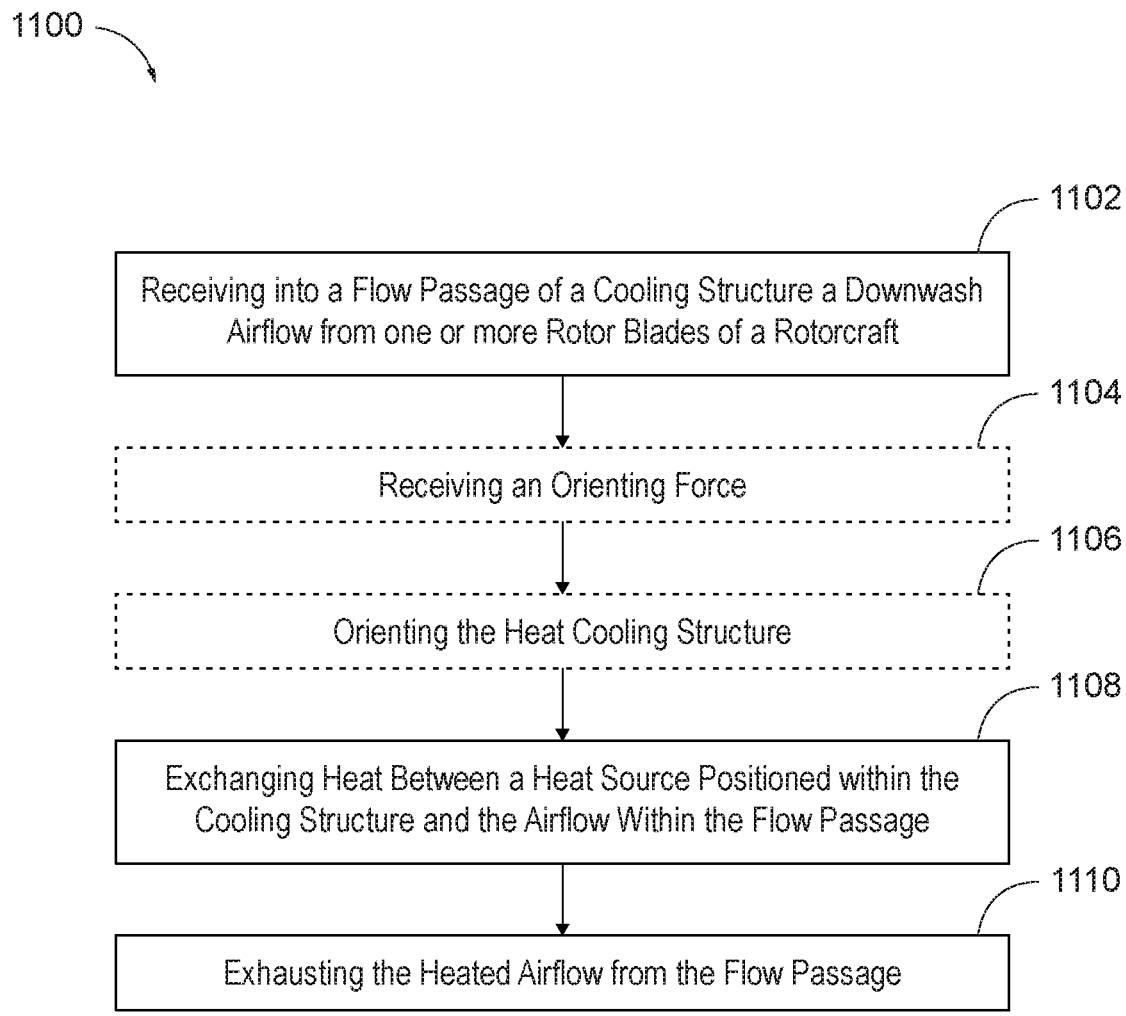
FIG. 15 is a flowchart schematically representing methods for enclosing an electronic component of a rotorcraft and facilitating convective heat transfer from the electronic component according to the present disclosure.

FIGS. 14-15 schematically provide flowcharts that represent illustrative, non-exclusive examples of methods 1000 and 1100 according to the present disclosure. In FIGS. 14-15, some steps are illustrated in dashed boxes indicating that such steps may be optional or may correspond to an optional version of a method according to the present disclosure. That said, not all methods according to the present disclosure are required to include the steps illustrated in solid boxes. The methods and steps illustrated in FIGS. 14-15 are not limiting and other methods and steps are within the scope of the present disclosure, including methods having greater than or fewer than the number of steps illustrated, as understood from the discussions herein.

FIG. 14 is a flowchart schematically representing methods 1000 for enclosing a heat source and facilitating convective heat transfer from the heat source. Methods 1000 include receiving a fluid into an inlet of a heat transfer device at 1002. The inlet is configured to receive a fluid from the environment of the heat transfer device. The heat transfer device further includes an outer wall and inner wall, wherein the inner wall defines a flow passage through the heat transfer device which includes the inlet. Additionally, the flow passage comprises an outlet configured to exhaust/ egress the fluid from the flow passage, and a core region extending between and in fluid communication with the inlet and the outlet.

The inner wall and the outer wall further define an internal volume therebetween, wherein the internal volume is configured to affix to at least one heat source. Example heat sources include, but are not limited to, an engine, a generator, an electronic device, an electronic component, wires carrying electrical current, fiber optics, an electrical circuit board, a communications device, a battery, a capacitor, a control moment gyroscope, etc. Alternatively (or in addition), the coupling element 900 and/or the external body 106 may be a component or totality of a battery or control moment gyroscope. For example, the heat transfer device may be coupled to an external body, and the internal volume may enclose circuitry for a computing system of the external body (e.g., creating an Internet of Things {Ion}). The device may be ESD-safe. It may (or may not) receive signals through the first body 702 and the second body 704.

At 1004, the inlet optionally may receive an orienting force from the fluid. For example, in some embodiments the inlet may have a funnel shape that causes fluid to strike the walls of the inlet and be directed radially inward as it flows towards the core region. In such embodiments, as the fluid is directed by the walls of the inlet the fluid applies an equal and opposite force to the walls of the inlet.

At 1006, the heat transfer device optionally may be oriented. In some embodiments, the heat transfer device may be oriented based on the orienting force received from the fluid. For example, in some embodiments, the heat transfer device is coupled to an attachment surface of an external body via one or more pivotal attachments/adapters. These pivotal attachments may include a pivot or joint that allows the heat transfer device to pivot, move, or rotate in one or more degrees of freedom relative to the attachment surface. In such embodiments, the pivot or joint may cause the heat transfer device to move and/or rotate in proportion to, and based upon, the orienting force received from the fluid. At 1008, the fluid is flowed from the inlet and into the core region of the heat transfer device.

Additionally, at 1010 the fluid is flowed within the core region of the heat transfer device. For example, where the heat transfer device is attached to a watercraft, water may flow through the inlet and within the core region of the heat transfer device as the watercraft moves through the water and/or as water moves past the craft. In some cases, the device may move in a periodic fashion, in some cases a stochastic fashion, in some cases a blend of periodic and stochastic fashion, and in some cases the reoccurring absence or presence of either or both.

At 1012, heat is exchanged between a heat source and the fluid within the core region. For example, where the heat transfer device at least partially encloses a heat source within the internal volume, heat may first be exchanged between the heat source and portions of the inner wall that define the core region of the flow passage, and then the heat is exchanged between the portions of the inner wall and the fluid within the core region. In some embodiments, the heat transfer device includes at least one heat transfer structure that extends inward into the core region from the inner wall. In such embodiments, heat may be exchanged between a heat source and the fluid within the core region via the at least one heat transfer structure. Heat may flow through, towards or from other portions of an affixed vehicle/machine.

At 1014, the fluid and the heat are exhausted from the core region and out of the heat transfer device via the outlet. In some embodiments, the fluid and heat may be exhausted into the environment of the heat transfer device. In this way, heat from the heat source is exhausted into the environment, reducing the temperature of the heat source.

FIG. 15 is a flowchart schematically representing methods for enclosing an electronic component of a rotorcraft and facilitating convective heat transfer from the electronic component. Methods 1100 include receiving into a flow passage of a cooling structure downwash airflow from one or more rotor blades of a rotorcraft at 1102. According to the present disclosure, the cooling structure may correspond to a heat transfer device 100. For example, in some embodiments the cooling structure may be a heat transfer device coupled to an attachment surface of a stub wing of the rotorcraft. In addition, the airflow may be received based upon the rotorcraft moving through the environment. For example, a headwind formed as the rotorcraft moves may flow into a flow passage of the cooling structure.

At 1104, the cooling structure optionally receives an orienting force. For example, the flow passage may include an inlet having walls that define a funnel shape. In such embodiments, as airflow strikes the walls of the inlet, the walls direct the flow of the airflow radially inward while receiving an equal and opposite orienting force.

At 1106, the cooling structure optionally is oriented. In some embodiments, the cooling structure may be oriented based on the orienting force received from the airflow. For example, in some embodiments, the cooling structure is coupled to an attachment surface of the rotorcraft via one or more pivotal attachments. These pivotal attachments may include a pivot or joint that allows the cooling structure to pivot, move, or rotate in one or more degrees of freedom relative to the attachment surface. In such embodiments, the pivot or joint may cause the cooling structure to move and/or rotate in proportion to, and based upon, the orienting force received from the airflow.

At 1108, heat is exchanged between a heat source positioned within the cooling structure and the airflow within the flow passage to create a heated airflow. In some embodiments, the cooling structure may comprise an outer wall and an inner wall, wherein the inner wall defines the flow passage. In such embodiments, heat may first be exchanged between the heat source and portions of the inner wall that define the flow passage, and then the heat is exchanged between the portions of the inner wall and the airflow within the flow passage. In some embodiments, the cooling structure includes at least one heat transfer structure that extends inward into the flow passage from the inner wall. In such embodiments, heat may be exchanged between a heat source and the airflow within the flow passage via the at least one heat transfer structure.

At 1110, the heated airflow is exhausted from the flow passage. For example, the heated airflow may be exhausted from the core region and out of the heat transfer device via the outlet. In some embodiments, the heated airflow may be exhausted into the environment of the cooling structure. In this way, heat from the heat source is exhausted into the environment, reducing the temperature of the heat source.

During operation the device may project audible noise or undetectable noise.

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

Illustrative, non-exclusive examples of inventive subject matter according to the present disclosure are described in the following enumerated paragraphs:

A1. A heat transfer device for enclosing a heat source and facilitating convective heat transfer from the heat source, comprising:

an outer wall having an outer surface exposed to an environment of the heat transfer device and defining an outer shape of the heat transfer device;

an inner wall defining a flow passage through the heat transfer device, wherein the outer wall and the inner wall collectively define an internal volume that is configured to house or otherwise affix to the heat source, and wherein the flow passage comprises:

an inlet configured to receive a fluid from the environment;

an outlet configured to exhaust the fluid from the flow passage; and a core region extending between the inlet and the outlet and configured to deliver the fluid from the inlet to the outlet and allow heat to exchange between the fluid within the core region and the internal volume.

A2. The heat transfer device of paragraph A1, wherein the heat source comprises wires carrying electrical current.

A3. The heat transfer device of any of paragraphs A1-A2, wherein the heat source comprises an electrical circuit board.

A4. The heat transfer device of any of paragraphs A1-A3, wherein the heat source comprises an electronic device.

A5. The heat transfer device of any of paragraphs A1-A4, wherein the heat source comprises a communications/data transfer device.

A6. The heat transfer device of paragraph A5, wherein the heat source comprises a radar device.

A7. The heat transfer device of any of paragraphs A1-A6, further comprising the heat source operatively installed within the internal volume.

A8. The heat transfer device of any of paragraphs A1-A7, wherein the outer shape generally is one of a sphere, an ovoid, a barrel, an elliptic, a rectilinear prism, a cylinder, a disc, a prolate spheroid, crescent, arc, arch, fin, fixed surface, and an oblate spheroid.

A9. The heat transfer device of any of paragraphs A1-A8, wherein at least one of the inner wall and the outer wall is configured to allow selective access to the internal volume.

A9.1. The heat transfer device of paragraph A9, wherein the at least one of the inner wall and the outer wall is configured to allow the heat source to be selectively installed within or removed from the internal volume.

A10. The heat transfer device of any of paragraphs A1-A8, further comprising a first body and a second body that collectively define the outer wall and the inner wall, wherein the first body and the second body are configured to allow selective access to the internal volume.

A10.1. The heat transfer device of paragraph A10, wherein the first body and the second body are configured to allow the heat source to be selectively installed within or removed from the internal volume.

A11. The heat transfer device of any of paragraphs A10-10.1, wherein: the first body comprises a first portion of the outer wall and a first portion of the inner wall; and the second body comprises a second portion of the outer wall and a second portion of the inner wall.

A12. The heat transfer device of any of paragraphs A10-A11, wherein the first body and the second body are mechanically coupled by one or more fastener mechanisms.

A12.1. The heat transfer device of paragraph A12, wherein the one or more fastener mechanisms allow the first body and the second body to be selectively uncoupled and recoupled without permanent damage.

A12.2. The heat transfer device of any of paragraphs A12-A12.1, wherein the one or more fastener mechanisms allow the first body and the second body to be selectively uncoupled and recoupled by rotating the first body relative to the second body.

A13. The heat transfer device of any of paragraphs A12-12.2, wherein the first body includes a first flange and the second body includes a second flange, and wherein the one or more fastener mechanisms join the first flange to the second flange.

A14. The heat transfer device of paragraph A13, wherein at least one of the first flange and the second flange has a sinusoidal outer rim surface.

A15. The heat transfer device of any of paragraphs A10-A14, wherein the first body and the second body are connected by at least one compression spring.

A16. The heat transfer device of paragraph A15, wherein the at least one compression spring biases the first body away from the second body.

A17. The heat transfer device of any of paragraphs A13-A16.1, wherein the first flange and the second flange are internal to the heat transfer device.

A18. The heat transfer device of any of paragraphs A12-A17, wherein the one or more fastener mechanisms include a rubberized O-ring fastener seal.

A19. The heat transfer device of any of paragraphs A12-A18, wherein the first body and the second body are joined by the one or more fastener mechanisms such that a coupling between the first body and the second body is waterproof and/or airtight.

A19.1. The heat transfer device of any of paragraphs A1-A19, further comprising a plurality of heat sources located at least partially within the internal volume.

A20. The heat transfer device of any of paragraphs A1-A19.1, wherein the flow passage is a first flow passage, and the inner wall defines a second flow passage through the heat transfer device.

A21. The heat transfer device of paragraph A20, wherein the first flow passage is in fluid communication with the second flow passage.

A22. The heat transfer device of paragraph A20, wherein the first flow passage is not in fluid communication with the second flow passage.

A23. The heat transfer device of any of paragraphs A20-A22, wherein the second passage is perpendicular to the first flow passage.

A24. The heat transfer device of any of paragraphs A1-A23, wherein the inner wall defines one or more additional flow passages.

A25. The heat transfer device of any of paragraphs A1-A24, wherein the heat transfer device further comprises heat transfer structures extending inwardly from the inner wall into the core region, and wherein the heat transfer structures are configured to facilitate heat exchange between the heat source and the fluid in the core region.

A26. The heat transfer device of paragraph A25, wherein the heat transfer structures further extend into the internal volume.

A27. The heat transfer device of any of paragraphs A25-A26, wherein the heat transfer structures are configured to cause turbulence of fluid flow as the fluid flows through the core region to increase the heat exchange between the heat source and the fluid.

A28. The heat transfer device of any of paragraphs A25-A28, wherein the heat transfer structures are arranged on the inner wall in a matrix pattern.

A29. The heat transfer device of any of paragraphs A25-A29, wherein the heat transfer structures are arranged on the inner wall in a staggered formation.

A30. The heat transfer device of any of paragraphs A25-A27, wherein the heat transfer structures comprise a plurality of pins, fins, needles, and/or ridges.

A31. The heat transfer device of paragraph A30, wherein the heat transfer structures are pins having a cross-sectional rhombus shape.

A32. The heat transfer device of any of paragraphs A25-A31, wherein at least one of a portion of the inner wall that defines the core region and the heat transfer structures is configured to cause the fluid in the core region to twist around a longitudinal axis of the flow passage as the fluid flows from the inlet to the outlet.

A33. The heat transfer device of paragraph A32, wherein the portion of the inner wall that defines the core region defines a helical flow path, and wherein the portion of the inner wall is configured to create turbulence in the fluid flow within the core region.

A34. The heat transfer device of any of paragraphs A25-A33, wherein at least one of a/the portion of the inner wall that defines the core region and the heat transfer structures are additively manufactured.

A35. The heat transfer device of any of paragraphs A25-A34, wherein there is an uninterrupted line of sight between the inlet and the outlet.

A36. The heat transfer device of any of paragraphs A25-A34, wherein there is not a line of sight between the inlet and the outlet.

A37. The heat transfer device of paragraph A36, wherein the heat transfer structures interrupt the line of sight between the inlet and the outlet.

A38. The heat transfer device of any of paragraphs A33-A37, wherein the line of sight is interrupted by the twist of the core region.

A39. The heat transfer device of any of paragraphs A1-A38, wherein the inlet comprises an outer opening that is adjacent to the outer wall and an inner opening that is adjacent to the core region, and wherein a diameter of the outer opening is greater than a diameter of the inner opening.

A40. The heat transfer device of paragraph A39, wherein the outer opening of the inlet adjoins the outer wall.

A41. The heat transfer device of any of paragraphs A1-A40, wherein a portion of the inner wall that defines the inlet is concave.

A42. The heat transfer device of any of paragraphs A1-A41, wherein a/the portion of the inner wall that defines the inlet has a concave vesica pisces shape.

A43. The heat transfer device of any of paragraphs A41-A42 when depending from paragraph A39, wherein a shape of the inlet directs the flow of fluid entering the outer opening toward the inner opening, which may minimize/optimize overflow.

A43.1 The heat transfer device of any of paragraphs A41-A43, wherein the outer wall is further configured to allow heat to be exchanged between the environment and the heat source.

A44. The heat transfer device of any of paragraphs A1-A43.1, further comprising a coupling element, wherein the coupling element is configured to mechanically couple to an attachment surface of an external body.

A45. The heat transfer device of paragraph A44, wherein the coupling element is configured to allow the heat transfer device to rotate in relation to the attachment surface when the coupling element is coupled to the attachment surface.

A46. The heat transfer device of any of paragraphs A44-A45, wherein the coupling element is configured to allow the heat transfer device to be repeatedly coupled to and uncoupled from the attachment surface without damage.

A47. The heat transfer device of any of paragraphs A44-A46, wherein the attachment surface is a first attachment surface, and wherein the coupling element is further configured to be attached to a second attachment surface.

A48. The heat transfer device of paragraph A47, wherein the second attachment surface is a different part of the external body.

A49. The heat transfer device of paragraph A47, wherein the second attachment surface is part of a different external body.

A50. The heat transfer device of any of paragraphs A44-A49, wherein the coupling element is adjacent to the outlet.

A51. The heat transfer device of any of paragraphs A44-A50, wherein the outlet is configured to exhaust the fluid and the heat into the environment.

A52. The heat transfer device of any of paragraphs A44-A51, wherein the coupling element comprises a pivotal support that enables the heat transfer device to rotate in one or more degrees of freedom relative to the attachment surface.

A53. The heat transfer device of paragraph A52, wherein the pivotal support comprises one or more gimbals.

A54. The heat transfer device of any of paragraphs A52-A53, wherein the pivotal support enables a force applied by the flow of fluid to orient the heat transfer device.

A55. The heat transfer device of any of paragraphs A44-A54, wherein the external body is a rotorcraft.

A56. The heat transfer device of paragraph A55, wherein the attachment surface is a stub wing of the rotorcraft.

A56.1. The heat transfer device of any of paragraphs A55-A56, wherein the fluid at least partially comprises downwash airflow from one or more rotor blades of the rotorcraft.

A57. The heat transfer device of paragraph A55, wherein the attachment surface is a rotor blade of the rotorcraft.

A57.1. The heat transfer device of any of paragraphs A55-A57, wherein the fluid at least partially comprises wind generated from movement of the rotorcraft.

A58. The heat transfer device of any of paragraphs A44-A54, wherein the fluid is air and the external body is one of: a windmill; a wind turbine; a drone aircraft; and an aircraft.

A59. The heat transfer device of any of paragraphs A44-A54, wherein the fluid is water and the external body is one of: a watercraft; and a submarine.

A60. The heat transfer device of any of paragraphs A44-A59, further comprising at least one vortex generator extending away from the outer surface of the outer wall.

A61. The heat transfer device of paragraph A60, wherein the at least one vortex generator comprises a plurality of vortex generators.

A62. The heat transfer device of any of paragraphs A60-A61, wherein the at least one vortex generator is not parallel with a/the longitudinal axis of the flow passage of the heat transfer device, and wherein the vortex generator is configured to generate a trailing vortex when the fluid flows across the vortex generator.

A63. The heat transfer device of paragraph A62, wherein the at least one vortex generator is configured to generate a trailing vortex to help draw airflow through the inlet and toward the core region.

A64. The heat transfer device of any of paragraphs A60-A63, wherein the at least one vortex generator is a bi-directional vortex generator that is configured to generate a trailing vortex when the fluid flows across the at least one vortex generators from a plurality of directions.

A65. The heat transfer device of any of paragraphs A1-A64, wherein one or more of the inlet and the outlet include perforations configured to ingest boundary layer flow of the fluid. A66. The heat transfer device of any of paragraphs A1-A65, further comprising a heat transfer fluid located within the internal volume A67. The heat transfer device of paragraph A66, wherein the heat transfer fluid is one of a foam, a liquid, and a gas.

A68. The heat transfer device of any of paragraphs A66-A67, wherein the heat transfer fluid is in contact with each of the heat source and the inner wall.

A69. The heat transfer device of any of paragraphs A66-A68 when depending from paragraph A26, wherein the heat transfer fluid is in contact with at least one of the heat transfer structures.

A70. The heat transfer device of any of paragraphs A1-A69, further comprising a thermal wafer positioned proximate to the core region and configured to cool the heat source.

B1. An aircraft, comprising a body and the heat transfer device of any of paragraphs A1-A54 and A60-A70 operationally coupled to the body.

B2. The aircraft of paragraph B1, wherein the aircraft is a rotorcraft.

B3. The aircraft of paragraph B2, wherein the rotorcraft comprises one or more rotor blades and a stub wing located downwind of the rotor blades, and wherein the heat transfer device is mechanically coupled to the stub wing and is positioned to receive a downwash airflow from the rotor blades.

B4. The aircraft of paragraph B2, wherein the heat transfer device is mechanically coupled to a rotor blade of the rotorcraft.

B5. The aircraft of any of paragraphs paragraph B1-B4, wherein the aircraft is a drone aircraft.

B6. The aircraft of paragraph B1, wherein the aircraft is a spacecraft or a vehicle which operates in space during a portion of operation.

B7. The aircraft of any of paragraphs B1-B5, wherein the aircraft is an airtaxi or aerial taxi.

C1. A watercraft, comprising a body and the heat transfer device of any of paragraphs A1-A54 and A60-A70 operationally coupled to the body.

C2. The watercraft of paragraph C1, wherein the watercraft is a submarine.

C3. The watercraft of paragraph C1, wherein the watercraft is a boat.

C4. The watercraft of paragraph C3, wherein the heat transfer device is coupled to an underwater surface of the boat.

C5. The watercraft of paragraph C3, wherein the heat transfer device is coupled to an above water surface of the boat.

C6. The watercraft of paragraph C3, wherein the heat transfer device is partially submerged.

D1. A windmill, comprising a body and the heat transfer device of any of paragraphs A1-A54 and A60-A70 operationally coupled to the body.

E1. The use of the heat transfer device of any of paragraphs A1-A70 to cool a heat source.

F1. A method for cooling a heat source, comprising: receiving a fluid into an inlet of a heat transfer device having an outer wall and an inner wall, wherein the inner wall defines a flow passage through the heat transfer device that comprises the inlet, a core region, and an outlet, and wherein an internal volume is defined between the outer wall and the inner wall; flowing the fluid from one or more inlets and into the core region of the heat transfer device; flowing the fluid within the core region of the heat transfer device; exchanging heat between the heat source and the fluid within the core region, wherein the heat source is at least partially located within the internal volume; and flowing the fluid and the heat from the core region and out of the heat transfer device via one or more outlets.

F2. The method of paragraph F1, wherein exchanging heat between the heat source and the fluid within the core comprises: receiving heat from the heat source by one or more heat transfer structures that extend inward into the core region from the inner wall; and exchanging heat between the one or more heat transfer structures and the fluid within the core region.

F3. The method of paragraph F2, wherein the heat transfer structures extend radially inward into the core region from the inner wall.

F4. The method of any of paragraphs F1-F3, wherein the heat transfer device is coupled to an attachment surface of an external body via one or more pivotal attachments, and wherein the method further comprises: receiving, from the fluid, an orienting force; and orienting, based on the orienting force, the heat transfer device.

F5. The method of any of paragraphs F1-F4, wherein receiving the fluid into the inlet of the heat transfer device comprises receiving the fluid into the inlet from an environment of the heat transfer device.

F6. The method of any of paragraphs F1-F5, wherein flowing the fluid and the heat from the core region and out of the heat transfer device comprises flowing the fluid and the heat from the core region and into an/the environment of the heat transfer device.

F8. The method of any of paragraphs F1-F7, performed by the heat transfer device of any of paragraphs A1-A70.

G1. A method for cooling a heat source, comprising: receiving into a flow passage of a cooling structure a downwash airflow from one or more rotor blades of a rotorcraft; exchanging heat between a heat source positioned within the cooling structure and the airflow within the flow passage to create a heated air flow; and exhausting the heated airflow from the flow passage.

G2. The method of paragraph G1, wherein exchanging heat between the heat source and the airflow within the flow passage comprises: receiving heat from the heat source by one or more heat transfer structures that extend inward into the flow passage from the inner wall; and exchanging heat between the one or more heat transfer structures and the airflow within the flow passage.

G3. The method of paragraph G2, wherein the heat transfer structures extend radially inward into the flow passage from the inner wall.

G4. The method of any of paragraphs G1-G3, wherein the rotorcraft comprises a stub wing, and wherein the cooling structure is coupled to an attachment surface of the stub wing, and wherein the method further comprises: receiving, from the airflow and by the flow passage, an orienting force; and orienting, based on the orienting force, the cooling structure.

G5. The method of any of paragraphs G1-G4, wherein the cooling structure comprises an outer wall and an inner wall, and wherein the inner wall defines the flow passage.

G6. The method of paragraph G5, wherein an internal volume is defined between the outer wall and the inner wall, and wherein the heat source is positioned within the internal volume.

G7. The method of any of paragraphs G1-G6, wherein the cooling structure is the heat transfer device of any of paragraphs A1-A70.

As used herein, the terms "adapted" and "configured" mean that the element, component, or other subject matter is designed and/or intended to perform a given function instantaneously or after a delay or at a later instance. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function. Surviving, including the impact of surviving, inter alia, the balancing of mass properties, can be a particular function. As used herein, "adapter" means a structural component between one device (e.g., XTS) and another device (e.g., a helicopter).

As used herein, the term "drone" means a vehicle that does not contain any living humans, man or woman, within, upon, or attached to the vehicle. As such, a "drone" which may fail due to a variety of events, including uncontained catastrophic decompression, will not injure or harm any human passengers/crew-members.

As used herein, the term "and/or" placed between a first entity and a second entity means one of (1) the first entity, (2) the second entity, and (3) the first entity and the second entity. Multiple entries listed with "and/or" should be construed in the same manner, i.e., "one or more" of the entities so conjoined. Other entities optionally may be present other than the entities specifically identified by the "and/or" clause, whether related or unrelated to those entities specifically identified. Thus, as a non-limiting example, a reference to "A and/or B," when used in conjunction with open-ended language such as "comprising," may refer, in one example, to A only as well as the reoccurring absence and presence of B (optionally including entities other than B); in another example, to B only as well as the reoccurring absence and presence of A (optionally including entities other than A); in yet another example, to both A and B as well as the reoccurring absence and presence of A and B (optionally including other entities). These entities may refer to elements, actions, structures, steps, operations, values, and the like.

The various disclosed elements of apparatuses and steps of methods disclosed herein were/are not required to all apparatuses and methods to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

The invention claimed is:

1. A heat transfer device operatively coupled to a body of a rotorcraft, the heat transfer device comprising:
    an outer wall having an outer surface exposed to an environment of the heat transfer device and defining an outer shape of the heat transfer device; and
    an inner wall defining a flow passage through the heat transfer device, wherein the outer wall and the inner wall collectively define an internal volume that is configured to house a heat source, and wherein the flow passage comprises:
        an inlet configured to receive a downwash airflow from at least one rotor blade of the rotorcraft;
        an outlet configured to exhaust the downwash airflow from the flow passage; and
        a core region extending between the inlet and the outlet and configured to deliver the downwash airflow from the inlet to the outlet and allow heat to exchange between the internal volume and the downwash airflow within the core region.

2. The heat transfer device of claim 1, wherein the body of the rotorcraft comprises a stub wing located downwind of the at least one rotor blade, and wherein the heat transfer device is mechanically coupled to the stub wing.

3. The heat transfer device of claim 1, further comprising at least one heat transfer structure extending inwardly from the inner wall into the core region, wherein the at least one heat transfer structure is configured to facilitate heat exchange between the heat source and the downwash airflow within the core region.

4. The heat transfer device of claim 1, wherein the heat source comprises one or more of an electronic device, wires carrying an electric current, and a radar device.

5. A heat transfer device for enclosing a heat source and facilitating convective heat transfer from the heat source, comprising:
    an outer wall having an outer surface exposed to an environment of the heat transfer device and defining an outer shape of the heat transfer device; and
    an inner wall defining a flow passage through the heat transfer device, wherein the outer wall and the inner wall collectively define an internal volume that is configured to house or otherwise affix to the heat source, and wherein the flow passage comprises:
        an inlet configured to receive a fluid from the environment;
        an outlet configured to exhaust the fluid from the flow passage; and
        a core region extending between the inlet and the outlet and configured to deliver the fluid from the inlet to the outlet and allow heat to exchange between the fluid within the core region and the internal volume.

6. The heat transfer device of claim 5, wherein the flow passage is a first flow passage and the inner wall defines a second flow passage through the heat transfer device.

7. The heat transfer device of claim 5, wherein the heat source comprises at least one of:
    wires carrying an electrical current;
    an electrical circuit board;
    an electronic device;
    a data transfer device;

a communications device;
a generator; and
an engine.

8. The heat transfer device of claim 5, further comprising a first body and a second body that collectively define the outer wall and the inner wall, wherein the first body and the second body are configured to allow selective access to the internal volume.

9. The heat transfer device of claim 8, wherein the first body and the second body are mechanically coupled by one or more fastener mechanisms that allow the first body and the second body to be selectively uncoupled and recoupled without permanent damage.

10. The heat transfer device of claim 8, wherein the first body and the second body are connected by at least one compression spring that biases the first body away from the second body.

11. The heat transfer device of claim 5, wherein the heat transfer device further comprises heat transfer structures extending inwardly from the inner wall into the core region, and wherein the heat transfer structures are configured to facilitate heat exchange between the heat source and the fluid in the core region.

12. The heat transfer device of claim 11, wherein the heat transfer structures comprise at least one of pins, fins, lattices, needles, and ridges.

13. The heat transfer device of claim 11, further comprising a coupling element configured to mechanically couple to an attachment surface of an external body.

14. The heat transfer device of claim 13, wherein the coupling element comprises a pivotal support that enables the heat transfer device to rotate in one or more degrees of freedom relative to the attachment surface.

15. The heat transfer device of claim 13, wherein the coupling element is configured to allow the heat transfer device to be repeatedly coupled to and uncoupled from the attachment surface without damage.

16. A method for cooling a heat source, comprising:
receiving a fluid from an environment of a heat transfer device into an inlet of the heat transfer device, the heat transfer device comprising an outer wall exposed to the environment and an inner wall, wherein the inner wall defines a flow passage through the heat transfer device that comprises the inlet, a core region, and an outlet, and wherein an internal volume is defined between the outer wall and the inner wall;
flowing the fluid from the inlet and into the core region of the heat transfer device;
flowing the fluid within the core region of the heat transfer device;
exchanging heat between the heat source and the fluid within the core region, wherein the heat source is at least partially located within the internal volume; and
flowing the fluid and the heat from the core region and out of the heat transfer device via the outlet.

17. The method of claim 16, wherein exchanging heat between the heat source and the fluid within the core region comprises:
receiving heat from the heat source by one or more heat transfer structures that extend inward into the core region from the inner wall; and
exchanging heat between the one or more heat transfer structures and the fluid within the core region.

18. The method of claim 16, wherein the heat transfer device is coupled to an attachment surface of an external body via one or more pivotal attachments, and wherein the method further comprises:
receiving, from the fluid and by the inlet and/or a surface of the heat transfer device, an orienting force; and
orienting, based on the orienting force, the heat transfer device.

19. The method of claim 16, wherein the fluid is a downwash airflow from one or more rotor blades of a rotorcraft.

20. The method of claim 16, wherein flowing the fluid and the heat from the core region and out of the heat transfer device comprises flowing the fluid and the heat from the core region and into an environment of the heat transfer device.

* * * * *